United States Patent
Zopf

(10) Patent No.: US 8,522,121 B2
(45) Date of Patent: Aug. 27, 2013

(54) LOW COMPLEXITY ERROR CORRECTION USING CYCLIC REDUNDANCY CHECK (CRC)

(75) Inventor: Robert W. Zopf, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 312 days.

(21) Appl. No.: 13/007,020

(22) Filed: Jan. 14, 2011

(65) Prior Publication Data

US 2011/0209029 A1 Aug. 25, 2011

Related U.S. Application Data

(60) Provisional application No. 61/306,031, filed on Feb. 19, 2010.

(51) Int. Cl.
*H03M 13/00* (2006.01)

(52) U.S. Cl.
USPC ............................................. 714/785

(58) Field of Classification Search
USPC ................ 714/746, 758, 782, 784, 786, 800
See application file for complete search history.

(56) References Cited

U.S. PATENT DOCUMENTS

| | | | |
|---|---|---|---|
| 4,413,339 A * | 11/1983 | Riggle et al. | 714/765 |
| 5,384,786 A * | 1/1995 | Dudley et al. | 714/784 |

* cited by examiner

*Primary Examiner* — Shelly A Chase
(74) *Attorney, Agent, or Firm* — Garlick & Markison; Shayne X. Short

(57) ABSTRACT

Communications between at communication devices, sometimes including at least one redundant transmission from a transmitter to a receiver, undergo low complexity error correction. CRC may be employed in conjunction with using any desired type of ECC or using uncoded modulation. Based on CRC determined bit-errors, as few as a singular syndrome associated with a singular bit-error or a linear combination of syndromes associated with two or more singular bit-errors within two or more received signal sequences are employed to perform error correction of the received signal. Real time combinations of multiple syndromes associated with respective single bit-errors (that may themselves be calculated off-line) are employed in accordance with error correction. In addition to CRC, any ECC may be employed including convolutional code, RS code, turbo code, TCM code, TTCM code, LDPC code, or BCH code.

29 Claims, 17 Drawing Sheets

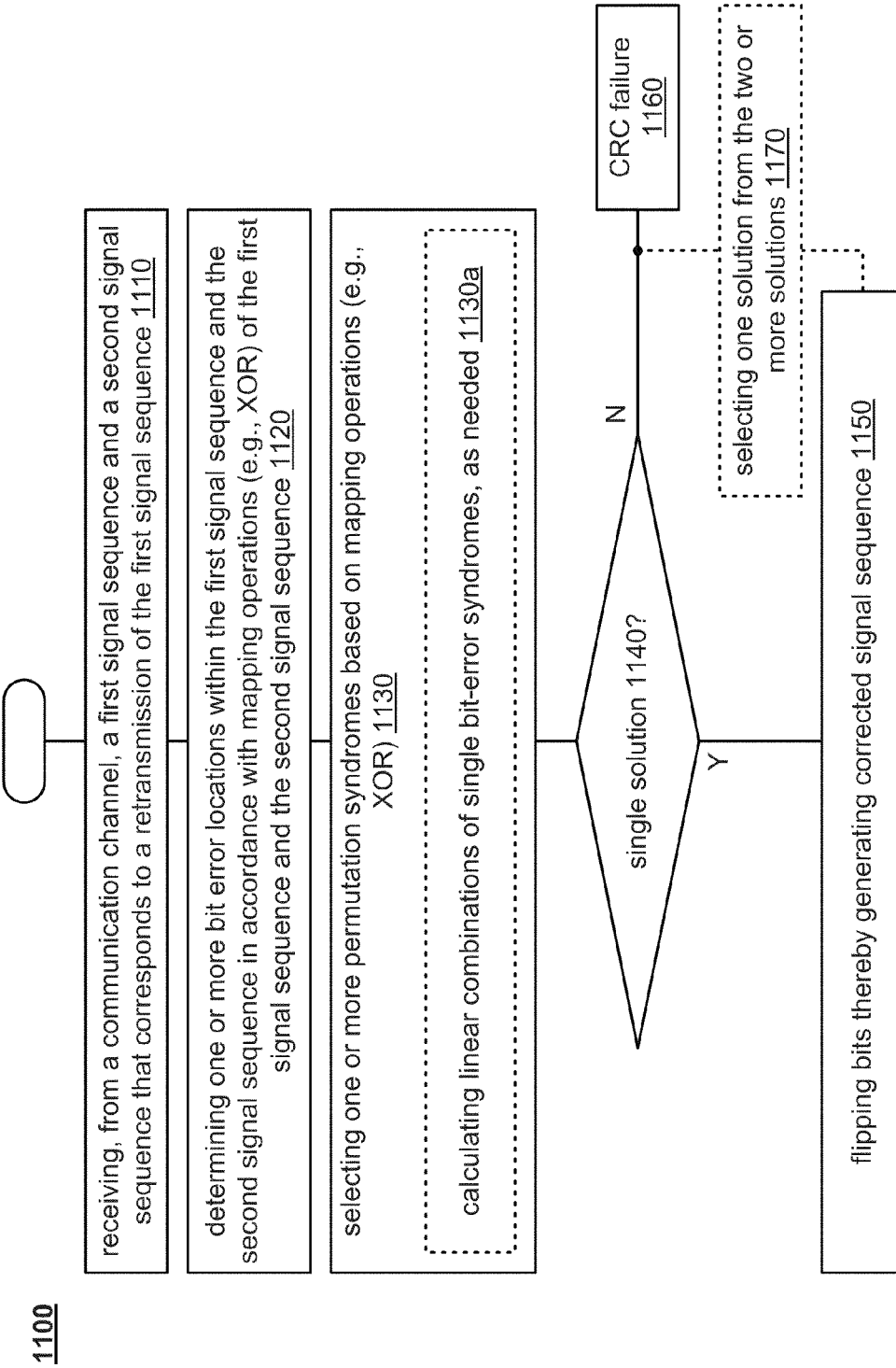

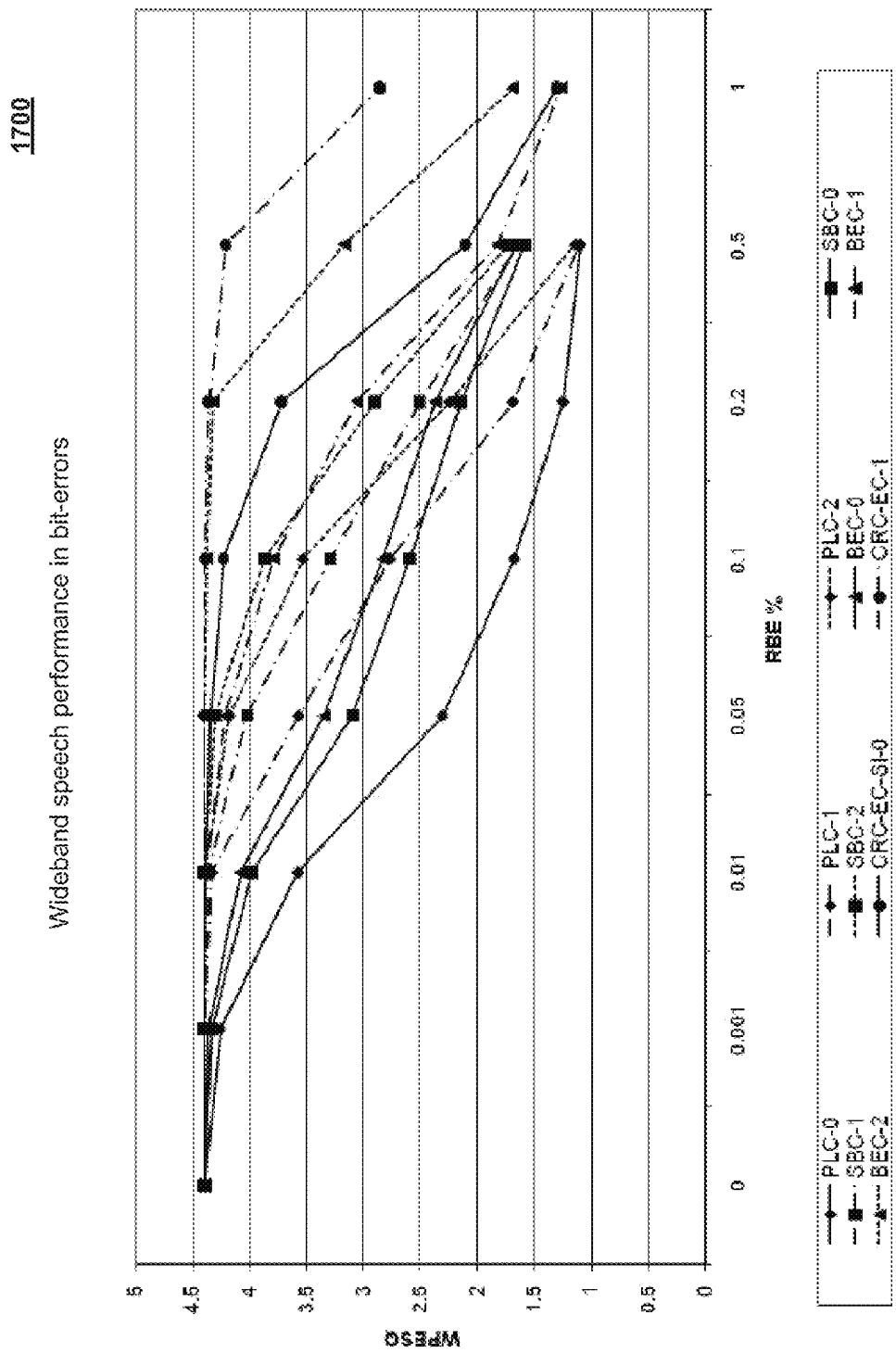

LOW COMPLEXITY ERROR CORRECTION USING CYCLIC REDUNDANCY CHECK (CRC)

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Application which is hereby incorporated herein by reference in its entirety and made part of the present U.S. Utility Patent Application for all purposes:

1. U.S. Provisional Application Ser. No. 61/306,031, entitled "Low complexity error correction using cyclic redundancy check (CRC) and redundant bit streams," filed Feb. 19, 2010, pending.

BACKGROUND OF THE INVENTION

1. Technical Field of the Invention

The invention relates generally to communication systems; and, more particularly, it relates to communication systems operating using cyclic redundancy check (CRC) and, sometimes, at least one redundant transmission therein, to perform error detection and correction.

2. Description of Related Art

Data communication systems have been under continual development for many years. One such type of communication system that has been of significant interest lately is a communication system that employs iterative error correction codes (ECCs) that operate in accordance with forward error correction (FEC). There are a variety of types of ECCs that may be employed in accordance with various communication systems (e.g., that seek to transmit information from one end of a communication link to another). Communications systems with iterative ECCs are often able to achieve lower bit error rates (BER) (or block error rate (BLER) in the context of block codes) than alternative codes for a given signal to noise ratio (SNR).

A continual and primary directive in this area of development has been to try continually to lower the SNR required to achieve a given BER (or BLER) within a communication system. The ideal goal has been to try to reach Shannon's limit in a communication channel Generally, Shannon's limit may be viewed as being the data rate to be used in a communication channel having a particular SNR that achieves error free transmission through the communication channel. In other words, the Shannon limit is the theoretical bound for channel capacity for a given modulation and code rate.

Generally speaking, within the context of communication systems that employ ECCs, there is a first communication device at one end of a communication channel with encoder capability and second communication device at the other end of the communication channel with decoder capability. In many instances, one or both of these two communication devices includes encoder and decoder capability (e.g., within a bi-directional communication system). ECCs can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

While there has been significant and ongoing development in the context of communication systems for some time, there nonetheless continues to be great effort directed to increasing the amount of information that may be transmitted through a communication channel (e.g., from a first communication device location at one end of the communication channel to a second communication device located at the other end of the communication channel) with lower error rates. There is a seemingly continual desire to transmit more and more information via a communication channel with lower and lower error rates. In spite of this, the prior art still does not provide adequate means by which this may be effectuated, and there seems to be a virtually limitless bound in the desire to transmit ever more information with ever lower error rates.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 11 illustrates an embodiment of a method for performing error correction using CRC and redundant bit streams.

FIG. 17 illustrates an embodiment of a diagram corresponding to speech quality for different retransmission and error concealment schemes.

DETAILED DESCRIPTION OF THE INVENTION

Figure 1:
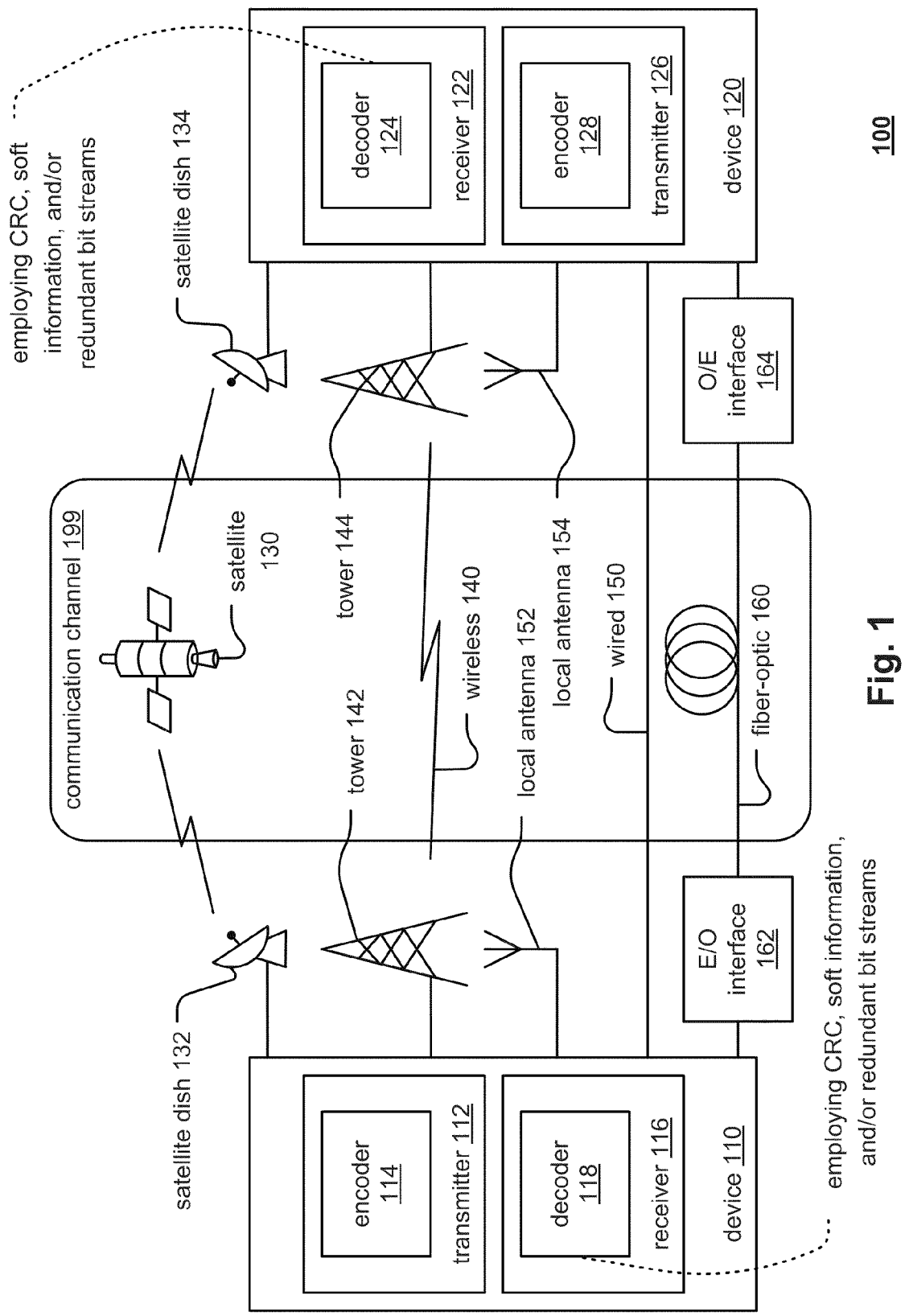
FIG. 1 and FIG. 2 illustrate various embodiments of communication systems.

A novel approach for performing error detection and correction is presented herein for use in communication systems that operate using cyclic redundancy check (CRC). In some instance, more than one transmission (e.g., at least one redundant transmission) sent from a sending or transmitting communication device to a receiving communication device is employed and properties associated with at least two transmissions (e.g., including at least one redundant transmission) are employed to identify possible error locations therein. For examples, such properties associated with at least two transmissions (e.g., including at least one redundant transmission) can include comparisons and/or processing of those at least two transmissions including performing XOR processing comparison of them.

In other instances, as few as a single transmission may be employed and properties associated with bits and/or symbols of that single transmission are used to identify possible error locations therein. For examples, such properties associated with a single transmission can include metrics, soft information, confidence levels (e.g., as associated with Viterbi detection or decoding), etc. Therefore, such low complexity error correction in accordance with various aspects of the invention can be applied across a wide variety of applications, communication systems, etc.

With respect to a multiple transmission embodiment, while as few as a single retransmission (or a single redundant stream) in conjunction with an original transmission may be employed in certain embodiments, the various aspects of the invention presented herein are of course applicable to communication systems operating using multiple retransmissions (or multiple redundant streams) in conjunction with an original transmission. It is noted that terminologies such as bit stream, stream, signal sequence, etc. (or their equivalents) may be used interchangeably to describe digital information whose content corresponds to any of a number of desired types (e.g., data, video, speech, audio, etc. any of which may generally be referred to as 'data').

CRC may be used for use in accordance with error detection (e.g., as opposed to performing not only detection but also correction). A request from a receiver for transmission of a redundant signal (e.g., a retransmission) to be made by a transmitter may be made based on a CRC check of a first signal failing (e.g., not equaling to zero). In some embodiments, when an error has been detected, bit flipping may be performed for correcting errors associated with the one or more identified error locations, but the use of bit flipping may be limited in certain contexts because, from certain perspectives, the CRC may need to be recomputed every time for each possible permutation of the signal sequence in which one of the bits has been flipped.

In addition, the correction capability of CRC is often viewed as being limited by the Hamming Distance (HD) of the CRC. As a result, while CRC does in fact have efficacy to detect the presence of one or more errors in a transmission, CRC may be the triggering event to request retransmission (e.g., if errors are found to be present in one of the transmissions in accordance with a CRC check). Herein, CRC can be employed also for performing error correction (in addition to mere error detection). Stated another way, a novel approach is presented herein for combining redundant bit-streams, or for using some information associated with the bits and/or symbols of a single bit-stream, having a respective CRC therein, to perform not only detection of errors therein, but also to correct any bit-errors therein. In some instances, the performance provided by this approach far exceeds that provided by other ECCs.

This novel approach presented herein has a relatively low complexity when compared to other error correction techniques, is source independent, and is also easily implementable across platforms making it suitable for a wide range of applications across a wide range of communication system types and communication device types. For example, because of the source independence of the approach presented herein, the error correction approach presented herein may be applied to any type of communication system operating on any type of digital information (e.g., data, video, speech, audio, etc. any of which may generally be referred to as 'data'). The error correction approach operates on a bit basis, and as such, can be easily implemented to treat and deal with any type of communication system that operates by transmitting digital information from a first location to a second location.

Moreover, the techniques may be applied to any communications system that operates using a single transmission of digital information or those employing at least one redundant copy of that digital information+the CRC. For example, various communication schemes may operate using some form of communication scheme employing at least one redundant transmission (e.g., at least one retransmission). There are a variety of factors that may trigger such a redundant transmission (e.g., a CRC check or failure thereof), and regardless of the precipitating or causal parameter that results in at least one redundant transmission, various aspects of the error correction techniques presented herein (using CRC in conjunction with at least one redundant stream) may be broadly applied across communication systems in which at least two redundant transmissions are employed (e.g., at least one transmission that is redundant with respect to one another transmission launched into the communication channel from a sending communication device). Of course, each of the at least two transmissions, while being identical in content at the transmitting end of the communication channel, may be affected differently during transmission via the communication channel (e.g., each respective transmission may be affected by different amounts of noise, jitter, spreading, etc. during transmission via the communication channel, such as when the operational characteristics of a communication channel are dynamic). As such, while the two transmissions are identical at the sending end of the communication channel, they may be different at the receiving end of the communication channel. Also, the processing at the receiving end of the communication channel of various received signals may be different (in rare instances), and this may undesirably affect the two streams differently (e.g., a sampling error, a glitch or otherwise as related to some operational parameter within the receiving communication device).

In the context of communication systems employing retransmissions, failed or successive transmissions (e.g., including one or more errors) may be stored at the receiving communication device to obtain the multiple copies of the transmissions for use in accordance with the various aspects of error correction presented herein. For example, one such communication system that operates in accordance with this complies with Bluetooth recommended standards and/or protocols. In even other communication systems, the digital information may be transmitted multiple times from the sending communication device to the receiving communication device without any request from the receiving communication device (e.g., retransmitted without being prompted by the receiving communication device). The error correction approach being presented herein may generally be applied to any communication system in which retransmission of at least one redundant signal stream is made, regardless of the reason that results in or causes the at least one redundant transmission.

Generally speaking, the goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media or any combination thereof as well.

Figure 2:
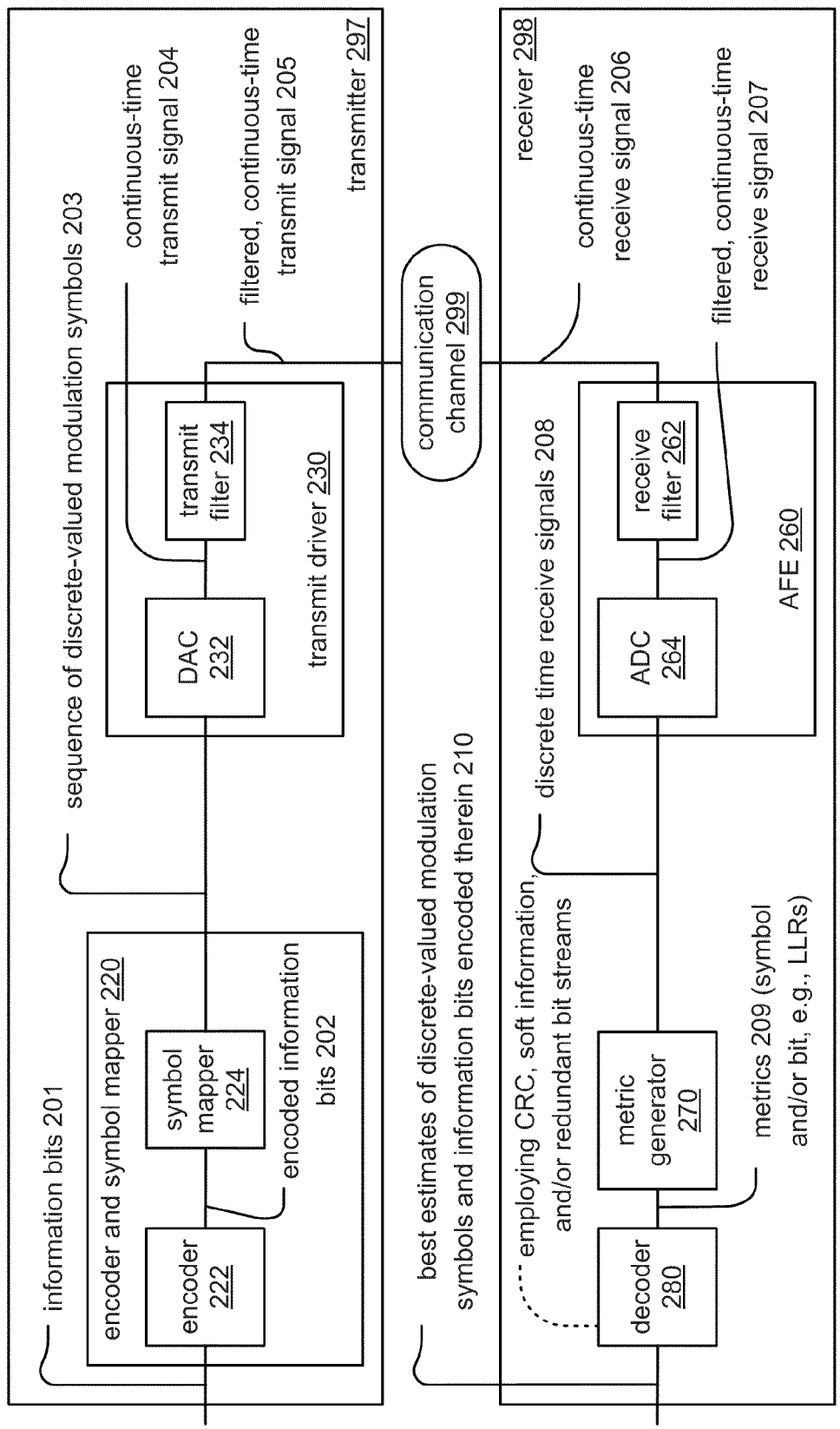

FIG. 1 and FIG. 2 illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. The respective receivers 116 and 122, including their respective decoders 118 and 124 therein, are operative to employ cyclic redundancy check (CRC), soft information (e.g., such as associated with a given, singular bit stream), and/or redundant bit streams when processing received signals in accordance with the various aspects presented herein. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Any of the various types of coding described herein can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. The transmit driver 230 may perform any necessary front end processing of a signal received from a communication channel (e.g., including any one or digital to analog conversion, gain adjustment, filtering, frequency conversion, etc.) to generate the filtered, continuous-time transmit signal 205.

At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). The AFE 260 may perform any necessary front end processing of a signal received from a communication channel (e.g., including any one or analog to digital conversion, gain adjustment, filtering, frequency conversion, etc.) to generate a digital signal provided to a metric generator 270 that generates a plurality of metrics corresponding to a particular bit or symbol extracted from the received signal. The metric generator 270 calculates metrics 209 (e.g., on either a symbol and/or bit basis) that are employed by a decoder 280 to make best estimates of the discrete-valued modulation symbols and information bits encoded therein 210. As within other embodiments presented herein, the receiver 298, including the respective decoder 280 therein, is operative to employ CRC, soft information (e.g., such as associated with a given, singular bit stream), and/or redundant bit streams when processing received signals in accordance with the various aspects presented herein. As the reader may understand, such soft information may be employed within embodiments employing redundant bit streams for providing even improved confidence in the location(s) of most likely (or potential) bit error locations.

The decoders of any of the various embodiments presented herein may be implemented to include various aspects and/or embodiments of the invention therein. In addition, several of the following Figures describe other and particular embodiments (some in more detail) that may be used to support the devices, systems, functionality and/or methods that may be implemented in accordance with certain aspects and/or embodiments of the invention.

It is noted that the transmitter 297 and the receiver 298, and/or individual blocks therein, may include more or fewer components, modules, circuitries, etc. than as depicted in the diagram in alternative embodiments without departing from the scope and spirit of the invention.

It is also noted that various types of error correction codes (ECCs) may be employed herein. For example, any one or more of any type or variant of a convolutional code, a Reed-Solomon (RS) code, a turbo code, a turbo trellis code modulation (TTCM) code, a low density parity check (LDPC) code, a BCH (Bose and Ray-Chaudhuri, and Hocquenghem) code, and/or any other type of ECC as well, etc. Moreover, as will be seen in various embodiments herein, more than one ECC and/or more than one type of ECC may be employed when generating a single encoded signal in accordance with the principles presented herein. For example, certain of the embodiments presented herein operate as product codes, in which an ECC is employed more than once or more than one type of ECC is employed (e.g., a first ECC during a first time and a second ECC at a second time) to generate an encoded signal.

Moreover, it is noted that both systematic encoding and non-systematic encoding may be performed in accordance with the various principles presented herein. Systematic encoding preserves the information bits being encoded and generates corresponding redundancy/parity bits (i.e., redundancy and parity may be used interchangeably herein); for example, the information bits being encoded are explicitly shown/represented in the output of non-systematic encoding. Non-systematic encoding does not necessarily preserve the information bits being encoded and generates coded bits that inherently include redundancy parity information therein; for example, the information bits being encoded need not be explicitly shown/represented in the output of non-systematic encoding. While many of the embodiments shown herein refer to systematic encoding, it is noted that non-systematic encoding may alternatively, be performed in any embodiment without departing from the scope and spirit of the invention.

Figure 3:
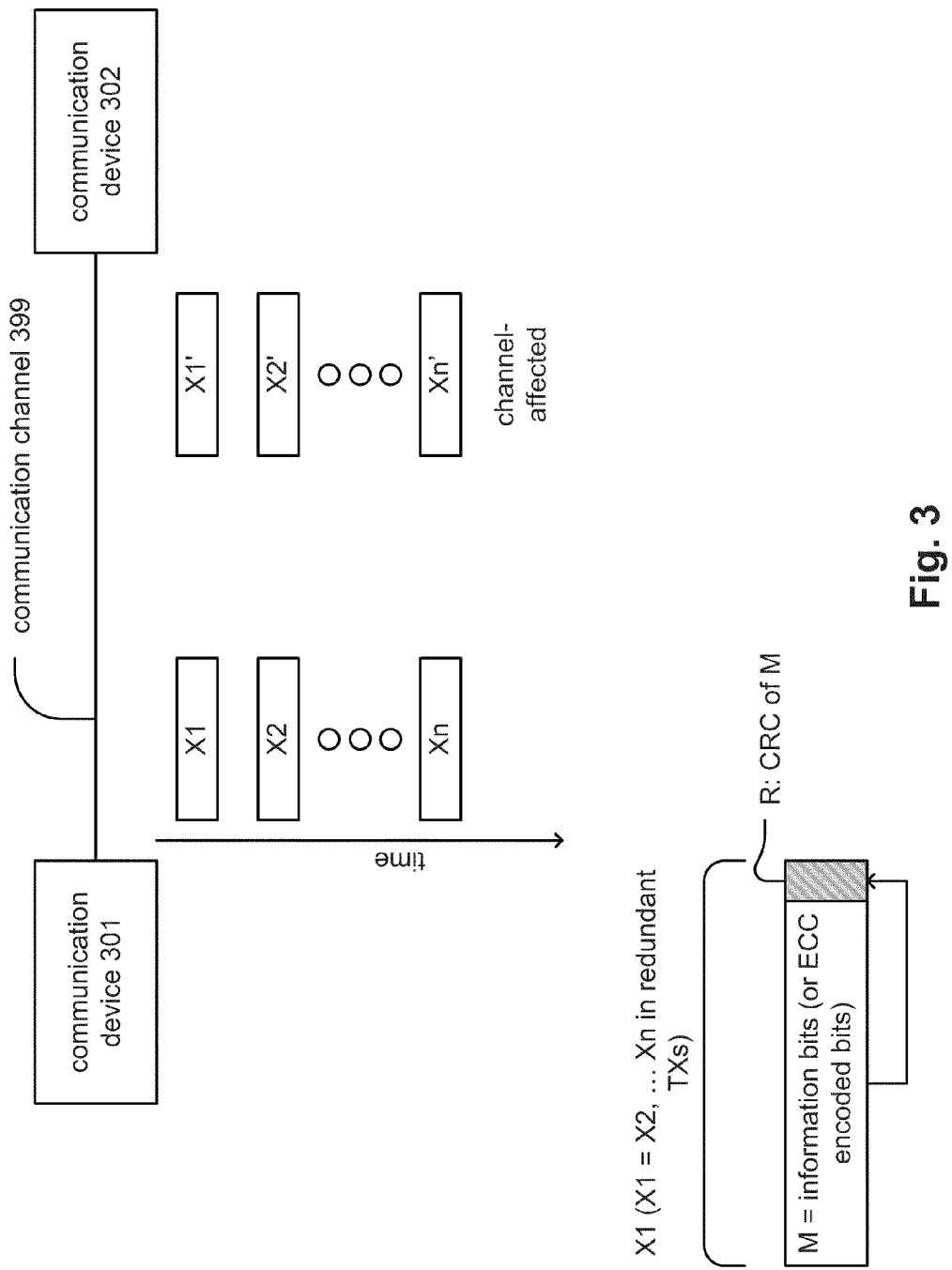
FIG. 3 illustrates an embodiment of a communication system operating in accordance with redundant transmissions.

FIG. 3 illustrates an embodiment of a communication system 300 operating in accordance with redundant transmissions. A communication device 301 and a communication device 302 are implemented for communications there between via a communication channel 399. Within this embodiment, as within others, the communication channel 399 itself may be of any type of communication channel (e.g., magnetic media, wired, wireless, fiber, copper, and other types of media or any combination thereof as well).

The communication device 301 sends more than one transmission to the communication device 302 via the communication channel 399. Each respective transmission may be affected differently by the communication channel 399. For example, the transmission X1 as sent by the communication device 301 may arrive as being a communication channel modified signal X1'. Analogously, the transmission X2 as sent by the communication device 301 may arrive as being a communication channel modified signal X2', and so on up to the transmission Xn as sent by the communication device 301 that may arrive as being a communication channel modified signal Xn'. In an embodiment that employs multiple redundant transmissions, the various transmissions X1, X2, and up to Xn may be the very same as sent by the communication device 301 (e.g., identical streams before being launched into the communication channel 399). However, as each respective transmission may be affected differently by the communication channel 399 (e.g., because the communication channel may be dynamic, in that, its characteristics are change as a function of time), although each respective is identical before being launched into the communication channel from the communication device 301, each may be different when arriving at the communication device 302.

In accordance with cyclic redundancy check (CRC), a number of information bits, shown as M, and alternatively, referred to as a message (the bits M may themselves be error correction code (ECC) encoded bits in some embodiments) is appended by one or more CRC bits, R, that are calculated based on the content of the information bits, M. Of course, while this embodiment shows the CRC bits being placed at the end of the frame or packet, it is noted that the CRC bits may be placed in different locations as opposed to at the end of the information bits, M, without departing from the scope and spirit of the invention. A brief review of CRC is presented below for the convenience of the reader.

Generally, CRC is based on division in the ring of polynomials over the finite field GF(2) (the integers modulo 2 finite field, where GF represents Galois Field), that is, the set of polynomials where each coefficient is either zero or one, and arithmetic operations wrap around (due to the nature of binary arithmetic).

Any string of bits can be interpreted as the coefficients of a message polynomial of this sort, and to find the CRC, the message polynomial is multiplied by $x^n$ and then the remainder is found when dividing by the degree-n generator polynomial. The coefficients of the remainder polynomial are the bits of the CRC.

This may be represented, in general form, as follows:

$$M(x) \cdot x^n = Q(x) \cdot G(x) + R(x) \quad (1)$$

where $M(x)$ is the original message polynomial and $G(x)$ is the degree-n generator polynomial. The bits of $M(x) \cdot x^n$ are the original message with n zeros added at the end. The CRC 'checksum' is formed by the coefficients of the remainder polynomial $R(x)$ whose degree is strictly less than n. The quotient polynomial $Q(x)$ is of no interest in most embodiments.

In communication, a sending communication device (e.g., communication device 301) attaches the n bits of R after the original message bits of M, sending the following:

$$D_S(x) = M(x) \cdot x^n - R(x) \quad (2)$$

The receiving communication device (e.g., communication device 302), knowing $G(x)$ and therefore n, separates M from R and repeats the calculation, comparing the computed remainder to the received one. If they are equal, then the receiving communication device assumes the received message bits are correct (e.g., that the bits within the message, M, are correct). Alternatively, the receiving communication device can compute the remainder for the complete message. However, because of any deleterious effects incurred by the communication channel 399, the received message may have been corrupted by bit-errors as shown below:

$$D_R(x) = D_S(x) + E(x) \quad (3)$$

The receiving communication device then computes $$R_R(x) = \text{REM}\{D_R(x)/G(x)\} \quad (4)$$

where REM$\{\cdot\}$ is the remainder.

Alternatively, if there are no bit-errors, then $D_R(x) = D_S(x)$ and $$\begin{aligned}
R_R(x) &= \text{REM}\{D_S(x)/G(x)\} \\
&= \text{REM}\left\{\frac{M(x) \cdot x^n - R(x)}{G(x)}\right\} \\
&= \text{REM}\left\{\frac{Q(x) \cdot G(x) + R(x) - R(x)}{G(x)}\right\} \\
&= \text{REM}\{Q(x)\} \\
&= 0
\end{aligned} \quad (5)$$

Hence, if the remainder is zero, the receiving communication device assumes the received message bits are correct (e.g., no errors were incurred within the message during its transmission via the communication channel 399).

It is again noted that the errors incurred during receipt at a receiving communication device 302, from the communication channel 399, may also be corrected (and not merely identified) using various aspects of the invention presented herein. For example, assuming a signal sequence was transmitted properly and without incurring any error during transmission via the communication channel 399, but assuming some error was incurred during receipt or preliminary processing at or within the receiving communication device 302 (e.g., during demodulation, digital sampling, etc.), those errors may also be not only detected, but corrected, using the various aspects of the invention presented herein.

With respect to the checksum that is calculated in accordance with CRC, errors incurred during transmission via the communication channel and specifically to particular bits within a transmitted signal sequence may be discriminated by at least one syndrome calculated in accordance with the CRC for each of the respective bits of the received signal sequence.

For example, if errors occur during transmission of a signal sequence, then $D_R(x) \neq D_S(x)$ and $$D_R(x) = D_S(x) + E(x) \quad (6)$$

where $E(x)$ is the error polynomial. From the above equations, it follows that:

$$R_R(x) = \text{REM}\{E(x)/G(x)\} \quad (7)$$

The error polynomial can be written as:

$$E(x) = \sum_{k=1}^{K} C_k \cdot x^k \quad (8)$$

where $C_k=1$ if there is a bit-error in the $k^{th}$ bit of the message, and $C_k=0$ otherwise. The remainder can then be rewritten as follows:

$$R_R(x) = \text{REM}\left\{\frac{\sum_{k=1}^{K} C_k \cdot x^k}{G(x)}\right\} \quad (9)$$

$$= \text{REM}\left\{\frac{C_1 \cdot x}{G(x)}\right\} + \text{REM}\left\{\frac{C_2 \cdot x^2}{G(x)}\right\} + \ldots + \text{REM}\left\{\frac{C_K \cdot x^K}{G(x)}\right\}$$

$$= C_1 \cdot S_1 + C_2 \cdot S_2 + \ldots + C_K \cdot S_K$$

and $$S_k = \text{REM}\{x^k/G(x)\} \quad (10)$$

is the syndrome produced by an error in the $k^{th}$ bit position in the K bit length received stream. As may be seen, respective syndromes may be calculated for errors (e.g., single bit errors) located in the various respective locations within various signal sequences. Such predetermined, pre-computed, pre-calculated syndrome information associated with single bit errors within each possible location within may be stored in memory for use in real time accessing and use in calculating any desired linear combination of syndromes to generate one or more permutation syndromes that satisfy or correspond to the identified error locations within at least one of the received bit streams. Moreover, efficiency of searching through and calculating such syndrome combinations may be made using properties of Gray Coding in the syndrome calculation operations. For example, in accordance with such Gray Coding, the combination or addition of two respective Gray Coded values can generate a third Gray Coded value. The use of such Gray Code properties can provide significant efficiency and speed by which such syndrome combinations may be made in accordance with such error detection and correction.

An important reason for the desirability of CRC for detecting the accidental alteration of data is the associated efficiency guarantee. Typically, an n-bit CRC, applied to a data block of arbitrary length, will detect any single error burst not longer than n bits, and will detect a fraction $1-2^{-n}$ of all longer error bursts. In addition to burst errors, the use of CRC may also be applicable for detection of isolated bit-errors. A Hamming weight N is the number of errors, out of all possible message corruptions, that may go undetected by a CRC using a particular polynomial. A set of Hamming weights captures the performance for different numbers of bits corrupted in a message at a particular data word length, with each successively longer data word length having set of Hamming weights with higher values. The first non-zero Hamming weight determines a code's Hamming Distance (HD). Most of the popular CRCs can also detect all errors with an odd number of bits by choosing $G(x)$ with an even number of terms.

Figure 4:
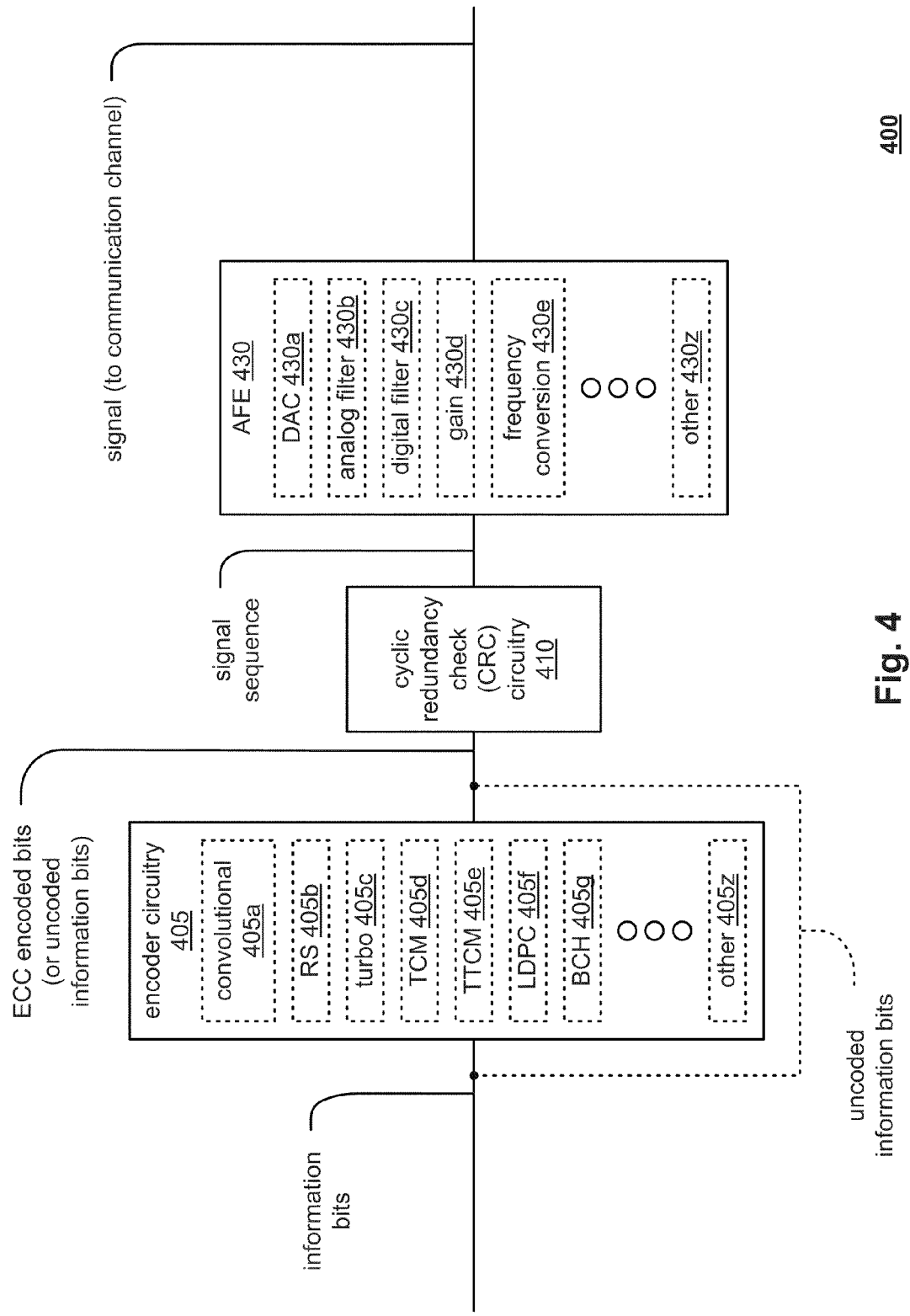
FIG. 4 illustrates an embodiment of a communication device operative to perform transmission of a signal.

FIG. 4 illustrates an embodiment of a communication device 400 operative to perform transmission of a signal. Information bits (e.g., again, which may generally be any type of information bits corresponding to data, video, speech, audio, etc. any of which may generally be referred to as 'data') are processed by the communication device 400. The information bits are provided to an encoder circuitry 405 that processes the information bits and generates error correction code (ECC) encoded bits there from. In embodiments that do not include or do not perform ECC encoding, uncoded information bits may be viewed as bypassing ECC encoding (e.g., bypassing an encoder circuitry 405 as shown in this embodiment), and then undergoing subsequent processing appropriate to generate a signal that may be transmitted via the communication channel.

When ECC is employed in a given embodiment, any desired type of ECC (or any combination thereof) may be employed by the encoder circuitry 405, including a convolutional code 405a, a Reed-Solomon (RS) code 405b, a turbo code 405c, a trellis coded modulation (TCM) code 405d, a turbo trellis coded modulation (TTCM) code 405e, a low density parity check (LDPC) code 405f, or a BCH (Bose and Ray-Chaudhuri, and Hocquenghem) code 405g, any combination thereof, and/or any other type of ECC as generally shown by block 405z.

These information bits (that may themselves have undergone ECC encoding) are then provided to a cyclic redundancy check (CRC) circuitry 410 that is operative to process the information bits and calculated one or more CRC bits based thereon. The output from the CRC circuitry 410 may generally be referred to as a signal sequence. This signal sequence is provided to an analog front end (AFE) 430 that is operative to perform any necessary processing to generate a signal that comports appropriately with a communication channel. For example, the AFE 430 may include any number of components therein (or perform any number of operations using such components). The AFE 430 may include a digital to analog converter (DAC) 430a, an analog filter 430b, a digital filter 430c, a gain module 430d, a frequency conversion module 430e, and/or any other circuitry, module, etc. The AFE 430 may perform any necessary front end processing of a signal to be launched into and transmitted via a communication channel (e.g., including any one or more of digital to analog conversion, gain adjustment, filtering, frequency conversion, etc.) to generate a signal that appropriately comports with the communication channel and that may be transmitted thereby.

Figure 5:
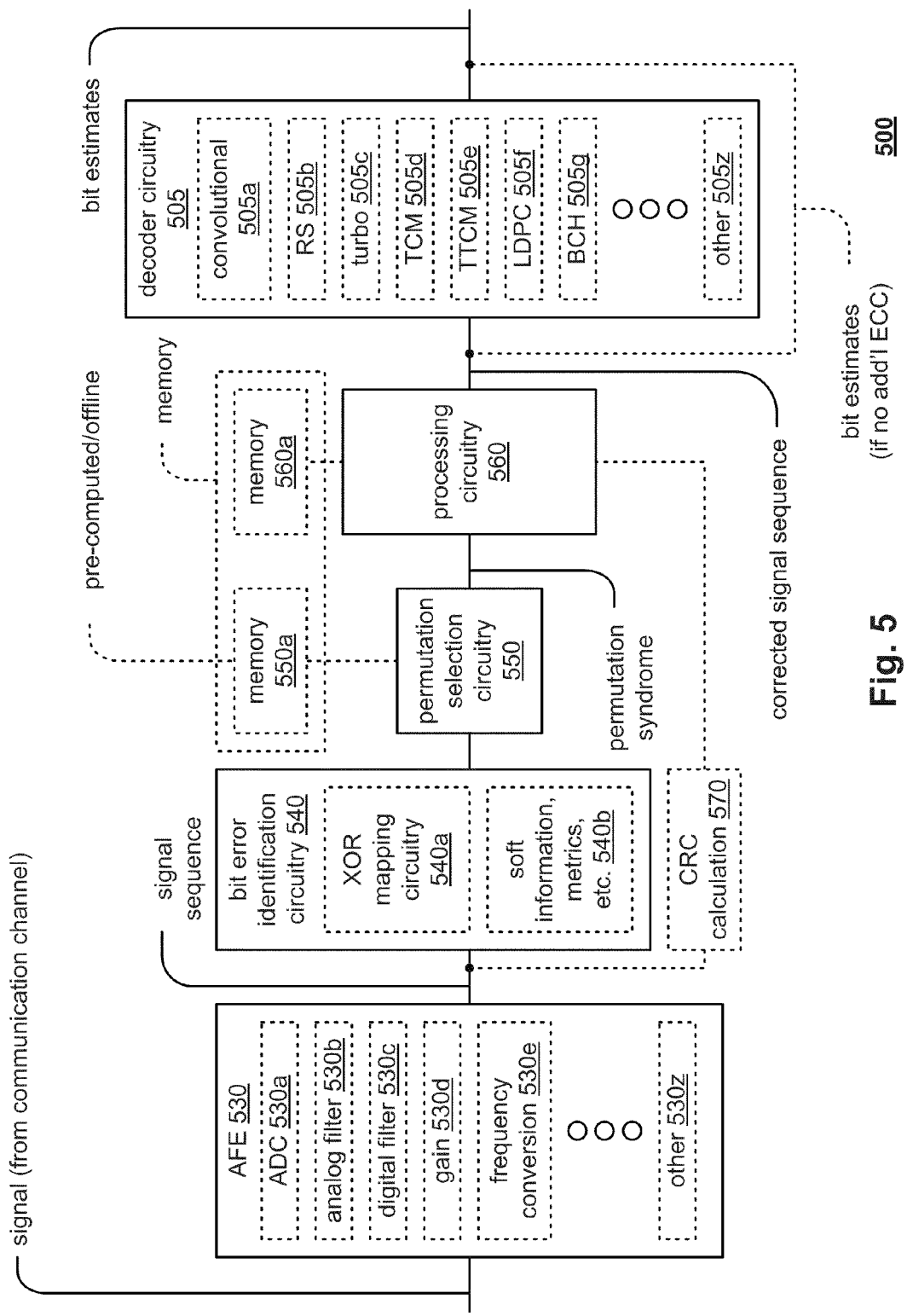
FIG. 5 illustrates an embodiment of a communication device operative to perform receipt of a signal.

FIG. 5 illustrates an embodiment of a communication device 500 operative to perform receipt of a signal. A signal, sent from a sending communication device, is received from a communication channel. At a receiving end of the communication channel, a signal is provided to an AFE 530 that may perform any necessary front end processing of a signal that is received from a communication channel (e.g., including any one or more of analog to digital conversion, gain adjustment, filtering, frequency conversion, etc.) to generate a signal sequence that may be processed in accordance with the various aspects of error correction presented herein. For example, the AFE 530 may include any number of components therein (or perform any number of operations using such components). The AFE 530 may include an analog to digital converter (ADC) 530a, an analog filter 530b, a digital filter 530c, a gain module 530e, a frequency conversion module 530e, and/or any other circuitry, module, etc. In certain embodiments and from certain perspectives, the signal sequence output from the AFE 520 is a baseband signal (e.g., a digital signal typically provided at a frequency corresponding to a clock frequency of the communication device 500 or an integer or sub-multiple of the clock frequency).

This signal sequence is then passed to a bit error identification circuitry 540 that is operative to identify, by processing bits and/or symbols of a signal sequence, error locations therein. There are a variety of means by which such bit error identification may be performed including employing at least two signal sequences and performing XOR processing of them to identify the bit locations in which such two signal sequences differ (e.g., where the bits in the same, respective location in two signal sequences are the same, the XOR result will be 0; alternatively, where the bits in the same, respective location in two signal sequences are different, the XOR result will be 1), as shown in a block 540a. Alternatively, such bit error identification may be performed using soft information, metrics, etc. as may be calculated on respective symbols and/or bits of a signal sequence, as shown in a block 540b. In this alternative embodiment, a singular signal sequence may undergo processing (e.g., using soft information, metrics, etc.) to identify the most likely (or potential) error locations therein, and a redundant signal sequence is not needed.

In addition, the received signal sequence may undergo CRC processing, such as using block 570, to determine if the CRC passes (e.g., if the CRC check provides a non-zero). Based on such a CRC triggering event, a subsequent transmission (e.g., a redundant transmission) may be requested from a transmitting communication device. The results of this CRC check may also be provided to a processing circuitry 560.

Once information is determined in regards to the most likely (or potential) error locations within the received signal sequence, using any desired manner or combination thereof, this information is passed to a permutation selection circuitry 550 that is operative to determine at least one permutation syndrome (e.g., a singular syndrome, a linear combination of syndromes, etc.) that corresponds to the calculated CRC remainder of the signal sequence (e.g., CRC remainder being non-zero). Syndromes associated with single bit-errors for each of the respective bit locations within a signal sequence may be calculated 'a priori' or off-line (e.g., generally speaking, not in real time but some time beforehand). Then, these predetermined values may be employed in real time to calculate any appropriate, possible combinations that may satisfy the constraints of the results of this CRC check. There may be situations in which more than one permutation syndrome satisfies the results of this CRC check.

Once one or more candidate permutation syndromes are determined, the processing circuitry 560 is operative to generate a corrected signal sequence using the received signal sequence, a redundant signal sequence, and/or a combination thereof. The corrected signal sequence may be provided to a decoder circuitry 505 that may perform ECC decoding thereon in accordance with the appropriate ECC used at the transmitter end of the communication channel (e.g., in a transmitting communication device). That is to say, this corrected signal sequence is then provided to a decoder circuitry 505 that is operative to make best estimates of information bits encoded therein.

In alternative embodiments in which the signal sequence does not correspond to any ECC encoding (e.g., uncoded modulation), the output from the processing circuitry 560 includes the best estimates of the information bits. Such an embodiment may be viewed as bypassing the decoder circuitry 505. With respect to the decoder circuitry 505, any desired type of ECC (or any combination thereof) may be employed by the decoder circuitry 505, including a convolutional code 505a, a Reed-Solomon (RS) code 505b, a turbo code 505c, a trellis coded modulation (TCM) code 505d, a turbo trellis coded modulation (TTCM) code 505e, a low density parity check (LDPC) code 505f, or a BCH (Bose and Ray-Chaudhuri, and Hocquenghem) code 505g, and/or any other type of ECC as generally shown by block 505z.

In accordance with performing error correction based on CRC, one approach involves performing bit flipping of the corresponding bits of the received signal sequence that are in the identified bit-error locations. For example, considering an embodiment in which there is a single bit-error in the received signal sequence or data stream, $D_R(x)$, then at the receiving communication device, the remainder as calculated in accordance with CRC will be non-zero. The receiving communication device could successively flip one-bit at a time and correspondingly re-compute the remainder for each of the possible modified signal sequences. For a given, potential corrected signal sequence, if the current bit position does not contain the original or actual bit-error, then the new stream (i.e., the potential corrected signal sequence) will then contain two errors (as opposed to a single bit-error). As long as the Hamming distance (HD) is greater than 2 (i.e., HD>2), then the remainder will be non-zero. However, if the current bit position does contain the actual error, then the received signal sequence of stream will equal the original stream and the remainder will be zero. In such an instance, the bit-error location is then known and the bit-error can be corrected.

Generally speaking, the received signal sequence may be viewed as containing P errors. However, the receiving communication device only knows that the remainder is non-zero which indicates only that there is at least one bit-error. No indication is given for the number of bit-errors present. The above described brute-force bit-flipping approach will correct the bit-errors if the following is true:

$$2 \cdot P < HD \tag{11}$$

To understand this relationship, consider that to correct P bit-errors, P bits must be flipped. Since the location of the errors is not known, it is possible to flip P correct bits, thus creating a stream with 2·P errors. If 2·P is equal or greater than HD, then the power of the CRC is exceeded, and the error stream with 2·P errors may generate a zero remainder. In practice, P is not known at the receiving communication device, and hence, any bit flipping may result in erroneously passing the CRC if $P \geq HD-1$.

It is noted that is a practical limitation to the above-described bit flipping approach. The number of times the CRC must be computed grows exponentially with the number of bit-errors present (and hence the number of bit-flips that must occur exhaustively to cover all of the possibilities). For example, consider P errors in a K-bit stream. There are $$\binom{K}{P} = \frac{K!}{P!(K-P)!} \quad (12)$$

combinations to consider. Considering a concrete example, if K=100 bits, and P=3, there are 161,700 bit-error permutations. Note that for even such a relatively small block size, a significantly large number of calculations must necessarily be made. Such a large number of CRC related calculations may not be desirable in certain applications (e.g., in terms of processing time constraints, desired latency, etc.).

However, because of the properties of the math used in computing CRCs, the full CRC computation need not be recomputed each time based on each possible signal sequence. This can be seen from the fact (as described above) that any error $R_R(x)$ may be viewed as being a linear combination of the possible single bit-error syndromes. Therefore, the calculation of the individual we only need to determine the $C_k$'s such that $$R_R(x) = C_1 \cdot S_1 + C_2 \cdot S_2 + \ldots + C_K \cdot S_K \quad (13)$$

All $$\binom{K}{P}$$

permutations need to be considered, but instead of re-computing the CRC, only n-bit sums need to be computed (n is the order of the CRC). All possible single-bit syndromes are pre-computed (e.g., calculated off-line) according to:

$$S_k(x) = \frac{C_k \cdot x^k}{G(x)} \quad k = 1 \ldots K \quad (14)$$

and stored in a memory (e.g., a table, look up table (LUT)), etc.) and retrieved to solve for $R_R(x)$. These values may then be viewed as being predetermined values against which calculated possible values of a received signal sequence are compared.

Figure 6:
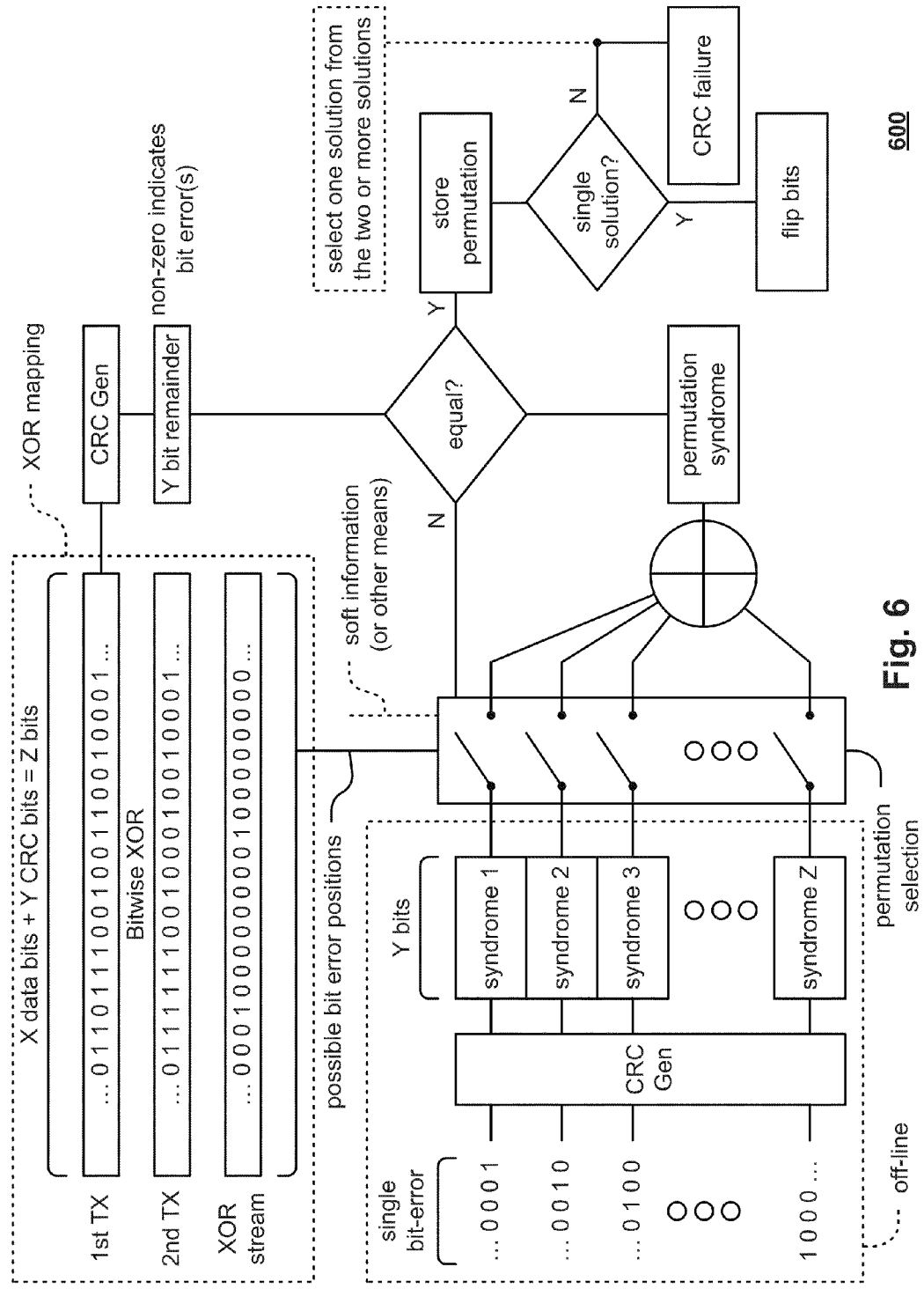
FIG. 6 illustrates an embodiment of a operations and functionality within a cyclic redundancy check (CRC) error correction (EC) decoder.

FIG. 6 illustrates an embodiment of a operations and functionality within a cyclic redundancy check (CRC) error correction (EC) decoder. One embodiment shows the use of two separate signal sequences, the second signal sequence being a re-transmission of the first signal sequence, that undergo XOR processing to identify the locations in which the two signal sequences are different. When undergoing XOR processing, where the bits in the same, respective location in two signal sequences are the same, the XOR result will be 0. Alternatively, where the bits in the same, respective location in two signal sequences are different, then the XOR result will be 1. The results of '1' provide indication as to where possible error locations may be in the received signal sequences.

While one embodiment employs XOR processing, it is noted that other means to perform error identification may be performed including using soft information, metrics, etc. as may be calculated in accordance with AFE processing, demodulation, metric generation, Viterbi detection and/or decoding, etc. Such information can provide indicia as related to the confidence level associated with a given symbol and/or bit decision, and a relatively lower confidence level may be used to provide indication as to the location of an error in a signal sequence. When using such means (soft information, etc.), a redundant signal sequence may not be needed to identify possible error locations therein. Therefore, soft information, or some other means, may be used to provide indication as to possible error locations within a signal sequence. As mentioned elsewhere herein, as the reader may understand, such soft information may be employed within embodiments employing redundant bit streams for providing even improved confidence in the location(s) of most likely (or potential) bit error locations.

Regardless of the manner by which possible error locations within a signal sequence are identified, these possible error locations are provided for selection of at least one permutation syndrome that corresponds to a CRC check remainder of the signal sequence. If a single possible error location solution is found, then the bits associated with the error locations may be flipped to generate a corrected signal sequence. Alternatively, if more than one possible error location solution is found, then either a CRC failure may be deemed, or one of the multiple solutions may be selected as being the 'correct' solution, and such appropriate bits may be flipped therein.

Figure 7:
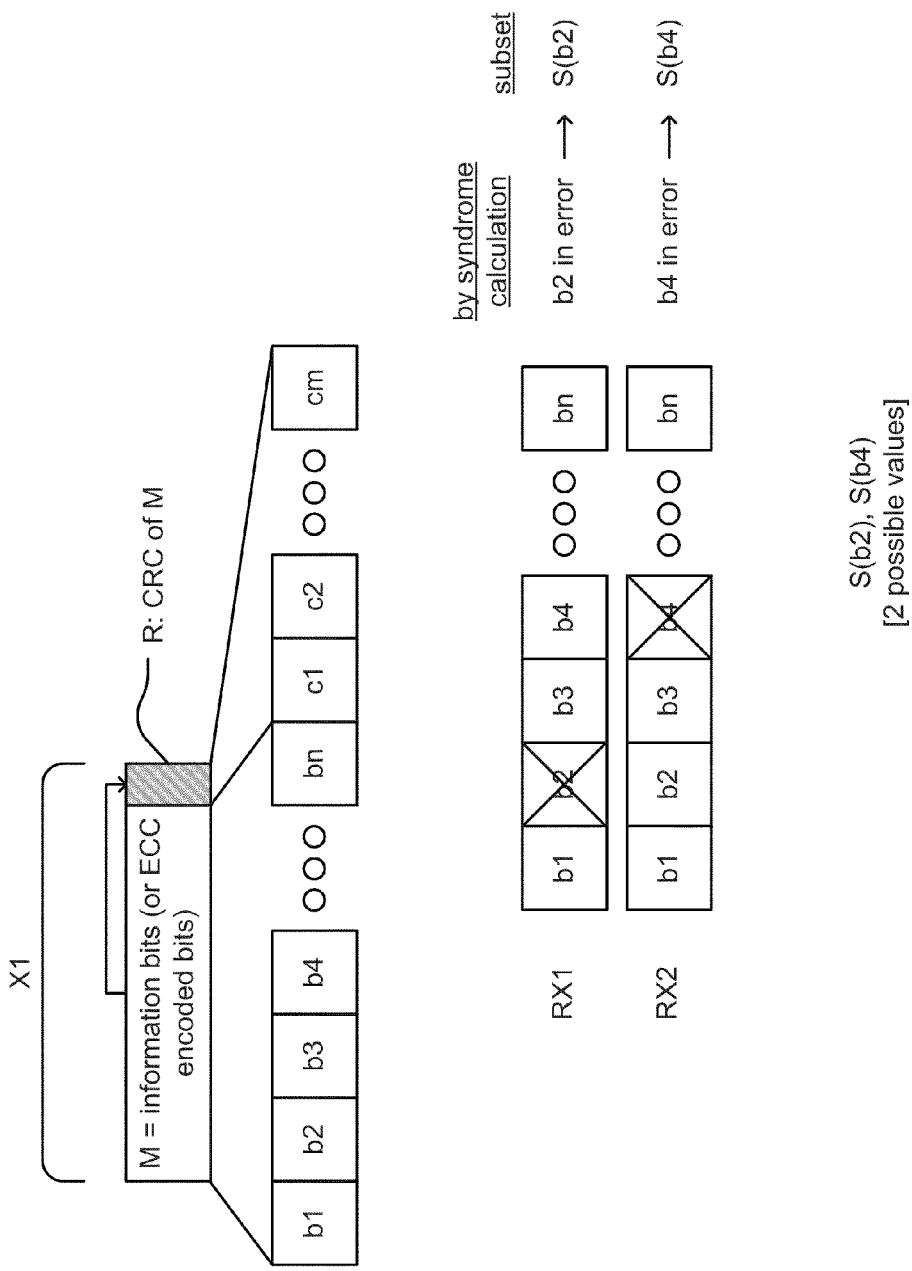
FIG. 7 illustrates an embodiment of one or more possible errors located within redundant signal sequences.

FIG. 7 illustrates an embodiment 700 of one or more possible errors located within redundant signal sequences. As described in several of the embodiments herein, aspects of the error correction approach presented herein operate in accordance with redundant signal sequences (e.g., at least one additional signal sequence that is a redundant transmission, or a retransmission, of another signal sequence).

The response by many receiving communication devices to a failed CRC is to request a retransmission of the same data (e.g., to request at least one additional redundant transmission of the previously received signal sequence). Each time that the CRC fails, the receiving communication device may request a retransmission from a sending communication device up to some configurable or predefined limit (e.g., L retransmissions). Hence, if upon the final retransmission, the CRC still fails, the receiving communication device then has L copies of the same data transmitted stream/signal sequence, each of which may have at least one error. The set of copies of the current data frame may be denoted as follows:

$$\{D_R^l(x)\} \; l=1 \ldots L \quad (15)$$

In accordance with the various embodiments of the operations of a mapping circuitry presented herein (and/or within an XOR mapping circuitry), the potential bit-error locations can be obtained by computing the bit-level exclusive-OR (XOR) operation (for L=2) (denoted with "^") on $\{D_R^l(x)\}$ as follows:

$$XORMAP_R(\{D_R^l(x)\}) = D_R^1 \char`\^ D_R^2 \; (\text{for } L=2) \quad (16)$$

If the total number of non-zero locations in $XORMAP_R(\;)$ is equal to $K_{XOR}$, then instead of needing to consider $$\binom{K}{P}$$

permutations, then only $2^{K_{XOR}}$ permutations are needed. Hence, only the bit-error locations determined by the non-zero locations of $XORMAP_R(\;)$ are used.

In this embodiment, $XORMAP_R(\;)$ indicates the location of bit-errors among the L streams, but it does not give a definitive indication of the location of bit-errors within each respective stream. For example, if L=2 ($D_R^1, D_R^2$) and XORMAP$_R(\;)$ is non-zero at bit locations {L1, L2, L3}, then one stream contains one error and the second stream contains two errors. It is not known which bit-error locations occur in each stream.

To correct the bits, one of the streams is selected (e.g., either one may be selected). In the derivation shown below, the first stream is selected. The remainder $R_R^1(x)$ for the first stream is computed. Let $\{L_1, L_2, \ldots, L_{K_{XOR}}\}$ be the non-zero locations of $XORMAP_R(\ )$. The following is then computed:

$$R_C^k(x) = C_{L_1} \cdot S_{L_1} + C_{L_2} \cdot S_{L_2} + \ldots + C_{L_{KXOR}} \cdot S_{L_{KXOR}} \quad (17)$$

for all $k$, where $$k=1, C_{L_1}=1, C_{L_2}=0, \ldots, C_{L_{KXOR}}=0$$

$$k=2, C_{L_1}=0, C_{L_2}=1, C_{L_3}=0, \ldots, C_{L_{KXOR}}=0$$

$$k=3, C_{L_1}=1, C_{L_2}=1, C_{L_3}=0, \ldots, C_{KXOR}=0$$

$$\ldots$$

$$k=2^{L_{KXOR}}, C_{L_1}=1, C_{L_2}=1, \ldots, C_{L_{KXOR}}=1. \quad (18)$$

As long as $XORMAP_R(\ )$ contains the locations of all of the bit-errors, then since all permutations are considered, it is guaranteed that $R_C^k(x) = R_R(x)$ for at least one k. If there is only one k that satisfies the equality, then it corresponds to the solution and the appropriate bits have been flipped. If there are multiple solutions, then one of the solutions is the correct one, and the remaining solutions are false positives corresponding to erroneous solutions when the HD of the CRC has been exceeded. In this case, the system can declare CRC failure, or one of the solutions may be chosen as the correct one. This selection may be based on which solution is most likely according to some decision-making criterion or criteria. For example, the channel error rate of the communication channel from which the signal sequence has been received may be estimated, and the solution that contains the most likely number of non-zero positions may then be selected.

It is noted that various aspects of the error correction technique presented herein are not limited to finding unique solutions that do not violate the HD. When the HD is exceeded, the CRC is not guaranteed to be unique. However, the majority of the bit combinations do produce a unique solution. For these cases, the error detection and concealment approach presented herein identified the unique solution and results in the corrected signal sequence. In addition, even if the CRC is not unique, the permutations considered by the non-zero bit locations of $XORMAP_R(\ )$ may not include any erroneous solutions. Again, in these cases, the error detection and concealment approach presented herein solves the problem.

While the embodiment described above shows the use of a single redundant stream (e.g., in addition to a first stream), it is noted that the error concealment approach presented herein may be extended to more than one redundant stream (e.g., multiple redundant streams in addition to a first stream) without departing from the scope and spirit of the invention.

Referring again to FIG. 7, the data is shown including n bits (e.g., b1, b2, and so on up to bn), and the CRC is shown as including m bits (e.g., c1, c2, and so on up to cm). This embodiment 700 shows a transmission, RX1, with a redundant transmission, RX2. In actuality, the bit in location b2 of RX1 is in error, and the bit in location b4 of RX2 is in error.

In accordance with the bit error identification operations (e.g., XOR mapping) performed on the first and second received streams, RX1 and RX2, bit errors are identified as being located in bit locations b2 and b4 in the two streams. The bit error identification operations (e.g., XOR mapping) is performed to compare the actual bit streams RX1 and RX2 to see where the location of the errors may be, and the locations correspond to bit locations b2 and b4. However, it is not known which of the errors is in fact located in which of the streams (e.g., whether error with respect to b2 is in RX1 or RX2, or whether error with respect to b4 is in RX1 or RX2).

Of all of the syndromes calculated for each of the respective bit locations of the two received signal streams (which may be pre-calculated or calculated off-line), the bit error identification operations (e.g., XOR mapping) is operative to identify those possible error locations so that only a subset of all possible syndrome permutations corresponding particularly to the errors located within bit locations b2 and b4 in RX1 and RX2 need be considered. To effectuate error correction, one or more permutation syndromes corresponding to errors being located in bit locations b2 and b4 in RX1 and RX2 may then be calculated in real time using pre-computed syndromes associated with single bit errors. As mentioned above with respect to embodiments including a first transmission and one additional transmission (e.g., a singular redundant transmission), one of the streams is selected. If the first stream is selected firstly (e.g., consider RX1), it is considered whether the error is located in each of the bit locations b2 and b4.

When comparing the calculated at least one permutation syndrome of RX1 to the calculated CRC check (e.g., CRC remainder), there will be a match between the calculated permutation syndrome of RX1 and the CRC check reminder corresponding to an error in bit position b2. This will indicate that the error within the RX1 stream is in fact located in bit location b2. Because the bit error location of RX1 is properly identified as being in bit locations b2, then it may be deduced that the bit error location of RX2 is identified as being in bit locations b4.

However, in an alternative embodiment, when processing RX2 initially, when comparing the calculated permutation syndrome to the CRC check reminder, the match will correspond to the calculated permutation syndrome of RX2 and the CRC check reminder corresponding to an error in bit position b4. As such, the error in RX2 may be properly identified in bit locations b4.

In one case, if RX1 is initially selected, the properly identified bit error is located in position b2, and that bit may be flipped to generate a corrected signal sequence. Alternatively, if RX2 is initially selected, the properly identified bit error is located in position b4, and that bit may be flipped to generate the corrected signal sequence.

When a single solution is arrived upon (e.g., a single permutation syndrome), this is a unique and correct solution and a corrected signal sequence may be generated. When more than one solution is arrived upon (e.g., two or more permutation syndromes), one of them may be selected as being the 'solution' using any desired decision means or constraint. Alternatively, when more than one solution is arrived upon (e.g., two or more permutation syndromes), a decoding failure may be declared.

Figure 8:
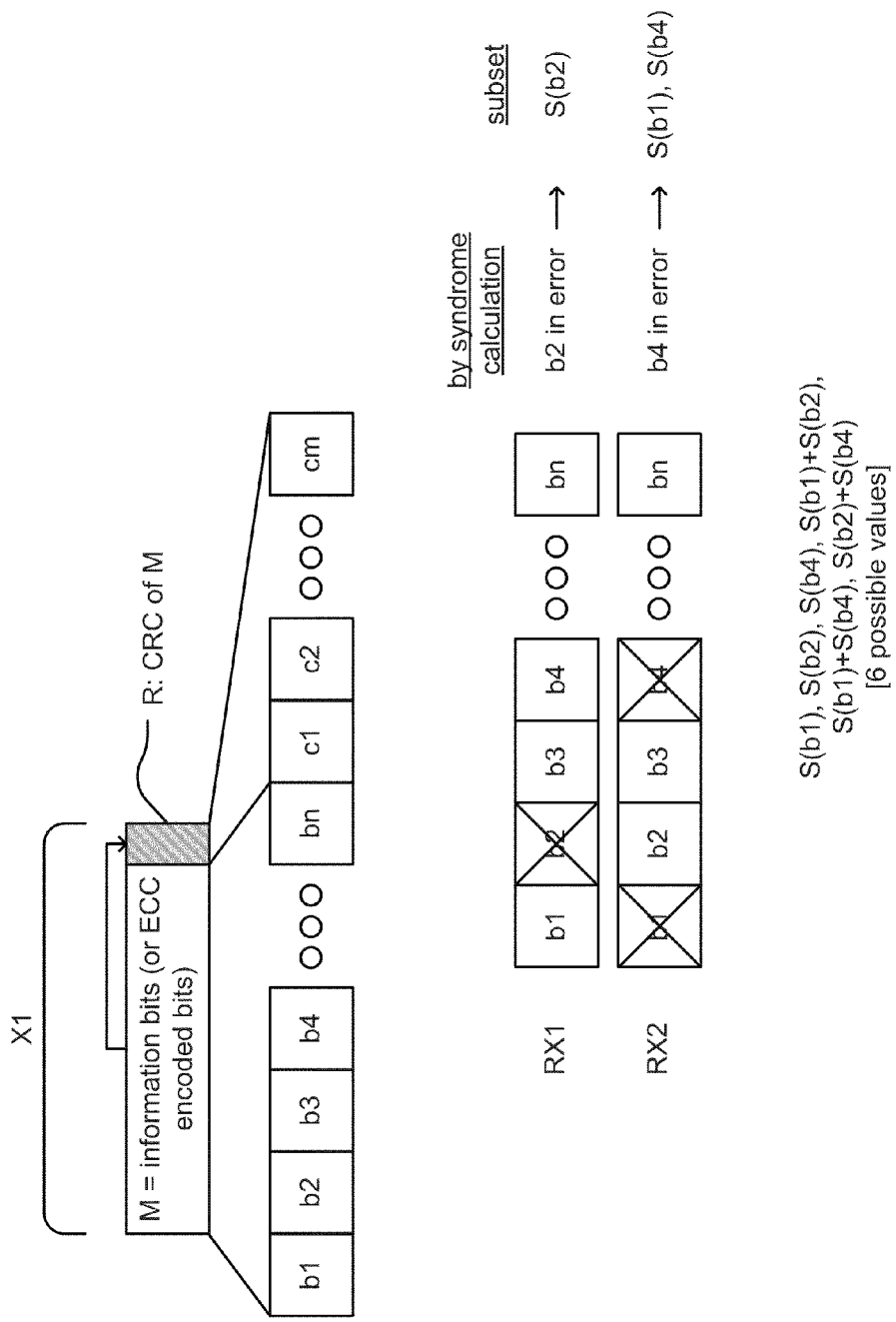
FIG. 8 illustrates an alternative embodiment of one or more possible errors located within redundant signal sequences.

FIG. 8 illustrates an alternative embodiment 800 of one or more possible errors located within redundant signal sequences. This embodiment 800 also shows a transmission, RX1, with another redundant transmission, RX2. However, in this embodiment 700, the bit in location b2 of RX1 is in error, and both the bits in locations b1 and b4 of RX2 are in error.

In accordance with the bit error identification processing (e.g., using XOR processing), possible bit error locations may be calculated for at least one of the respective signal sequences. Bit error identification processing (e.g., using XOR processing) is performed to compare the actual bit streams RX1 and RX2 to see where the location of the errors may be. If the bit values are the same in accordance with the XOR mapping, then the resultant is 0 (e.g., both bits are the same in that respective bit location), or the resultant is 1 (e.g., both bits are the different in that respective bit location).

Thereafter, at least one permutation syndrome is identified that corresponds to the CRC check remainder based on the possible bit error locations. For example, one of the streams is selected. If the first stream is selected (e.g., consider RX1), it is considered whether the error or errors are located in each of the bit locations b1, b2, and/or b4. Unlike the previous embodiment 700 of FIG. 7 (that included only one error in each respective stream RX1 and RX2), because there are three error locations in the embodiment 800 of FIG. 8 (e.g., one error in RX1, and two errors in RX2), there are in fact six possible error scenarios that must be considered. Specifically, three of these possible values correspond to the instance where a stream includes one bit error in each of bit locations b1, b2, or b4, respectively. Also, three of these possible values correspond to the instance where a stream includes two bit errors in each of bit locations "b1 and b2", "b2 and b4", or "b2 and b4".

The combined values corresponding to each of the instances of a stream including two bit errors may be generated by a linear combination of individual bit errors in each of the two respective locations (e.g., bit errors in the two bit locations "b1 and b2" being a linear combination of a bit error in location b1 plus a bit error in location b2, bit errors in the two bit locations "b1 and b4" being a linear combination of a bit error in location b1 plus a bit error in location b4, etc.).

When one of the two streams is initially selected, RX2, and then if the determined permutation syndrome of that stream matches the calculated CRC check remainder that corresponds to errors being located bit positions "b1 and b4", then a unique and correct solution has been found. Again, when a single solution is arrived upon (e.g., a single permutation syndrome), this is a unique and correct solution and a corrected signal sequence may be generated. When more than one solution is arrived upon (e.g., two or more permutation syndromes), one of them may be selected as being the 'solution' using any desired decision means or constraint. Alternatively, when more than one solution is arrived upon (e.g., two or more permutation syndromes), a decoding failure may be declared.

Figure 9:
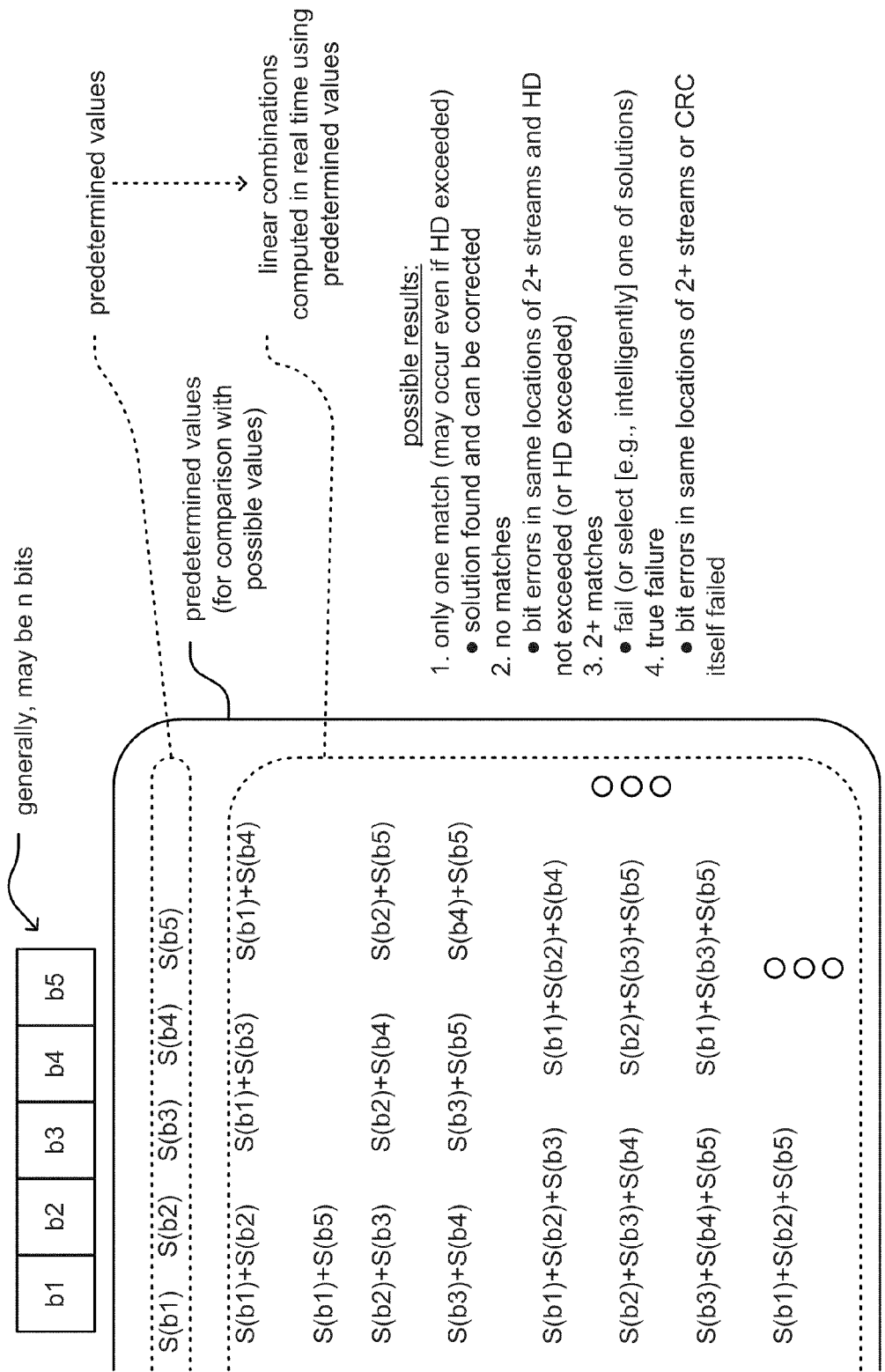
FIG. 9 illustrates an embodiment of possible values that may be calculated to correct for errors located within redundant signal sequences.

FIG. 9 illustrates an embodiment 900 of possible values that may be calculated to correct for errors located within redundant signal sequences. Certain of the previous embodiments relate to situations in which either one or two bit errors may be located in each stream. However, there may be instances where more than two bit errors may occur in each stream. A stream showing 5 bits is depicted in this diagram (e.g., b1, b2, b3, b4, b5). Of course, a stream including more or less than 5 bits may alternatively be employed without departing from the scope and spirit of the invention. This diagram shows the large number of linear combinations of predetermined values that may be needed in a given embodiment (e.g., for use in comparing with the calculated CRC remainder based on the most likely (or potential) error locations within the received signal(s), such as may be determined using XOR processing, soft information, etc.).

Considering the situation for which a singular bit error occurs in a given stream, then predetermined syndromes for each of the respective bit locations within the signal sequence, namely, S(b1), S(b2), and so on may be calculated (e.g., off-line). Considering the situation for which two bit errors occur in a given stream, then certain linear combinations of these predetermined syndromes for each of the combination of two bits, such as S(b1)+S(b2), S(b1)+S(b3), S(b1)+S(b4), and so on, can be calculated. Considering the situation for which three bit errors occur in a given stream, then certain linear combinations of these predetermined syndromes for each of the combination of three bits, such as S(b1)+S(b2)+S(b3), S(b1)+S(b2)+S(b4), S(b2)+S(b3)+S(b4), and so on, can be calculated.

As may be seen, a very large number of permutation syndromes values may need to be calculated in real time using the single bit-error syndromes calculated. While one embodiment envisions that the linear combinations of predetermined syndromes be calculated in real time (e.g., once the most likely (or potential) error locations within the received signal(s) are determined), other embodiments envision that the linear combinations of predetermined syndromes be calculated off-line. That is to say, while such single bit-error syndrome calculations may be performed entirely off-line, any linear combinations thereof typically may be calculated in real time.

As mentioned above, if a singular and unique solution is arrived upon, then the stream may be corrected and the corrected signal sequence may be output. It is again noted that this situation may occur even if the HD of the CRC is exceeded. As is described further below with respect to certain performance diagrams, this may result in very high performance with exceptional error correction capability.

However, there may be instances where a singular and unique solution is not arrived upon. For example, there may be instances where no matches are found. In such instances, the bit errors in multiple streams may be in the very same locations of the multiple streams, and the HD of the CRC may not be exceeded. Alternatively, this may be associated with a situation in which the correct bit error locations are not in the search grid (e.g., region across which errors are searched for). Of course, when the HD of the CRC is exceeded, erroneous solutions may be arrived upon.

In other instances, more than two matches may be found when making the comparison between the possible values and the predetermined values (e.g., that may have been calculated before hand). The error correction approach may then either declare that the decoding had failed, or alternatively, select one of the solutions as being the correct solution based on some criterion or criteria.

There may be another situation in which the CRC itself has failed. This 'true' failure may occur when the CRC simply failed to locate the bit error locations properly. Also, this 'true' failure may occur if bit errors are respectively located in the very same locations in two or more of the streams (a situation that should occur quite seldom).

Figure 10A:
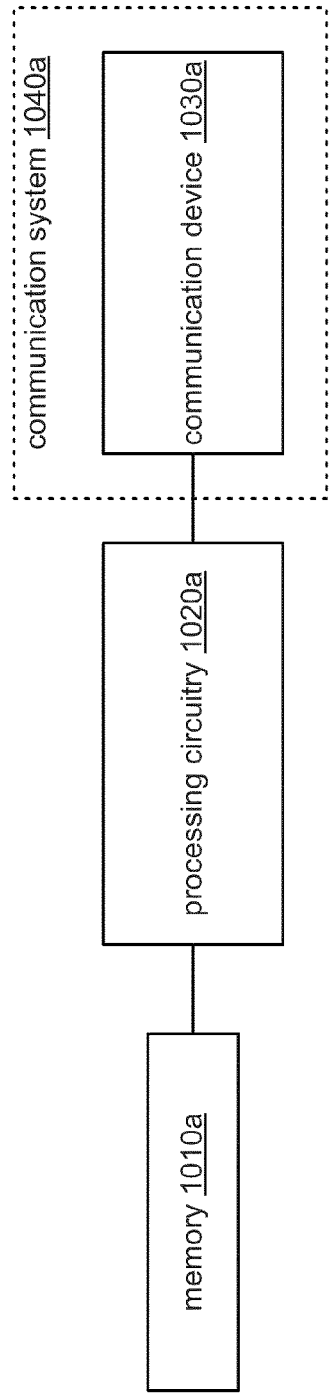
FIG. 10A illustrates an embodiment of an apparatus that is operative to perform error correction using cyclic redundancy check (CRC) and redundant bit streams.

FIG. 10A illustrates an embodiment of an apparatus 1001 that is operative to perform error correction using cyclic redundancy check (CRC) and redundant bit streams. The apparatus 1001 includes a processing circuitry 1020a, and a memory 1010a. The memory 1010a is coupled to the processing circuitry 1020a, and the memory 1010a is operable to store operational instructions that enable the processing circuitry 1020a to perform a variety of functions. The processing circuitry 1020a is operable to perform error correction using CRC and redundant bit streams.

The processing circuitry 1020a can be implemented using a shared processing device, individual processing devices, or a plurality of processing devices, among other types of circuitry or circuitries. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 1010*a* may be a single memory device or a plurality of memory devices. Such a memory device may be a read-only memory, random access memory, volatile memory, non-volatile memory, static memory, dynamic memory, flash memory, and/or any device that stores digital information. Note that when the processing circuitry 1020*a* implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired, the apparatus 1020*a* can be designed to generate and perform multiple means of performing error correction using CRC and redundant bit streams in accordance with multiple needs and/or desires as well. In some embodiments, the processing circuitry 1020*a* can selectively provide different information (e.g., corresponding to different error correction using CRC and redundant bit streams, etc.) to different communication devices and/or communication systems. That way, different communication links between different communication devices can employ different error correction using CRC and redundant bit streams. Clearly, the processing circuitry 1020*a* can also provide the same information to each of different communication devices and/or communication systems as well without departing from the scope and spirit of the invention.

If desired, the communication device 1030*a* may be implemented in a communication system 1040*a*, and the processing circuitry 1020*a* and memory 1010*a* may be located remotely with respect to the communication device 1030*a*.

Figure 10B:
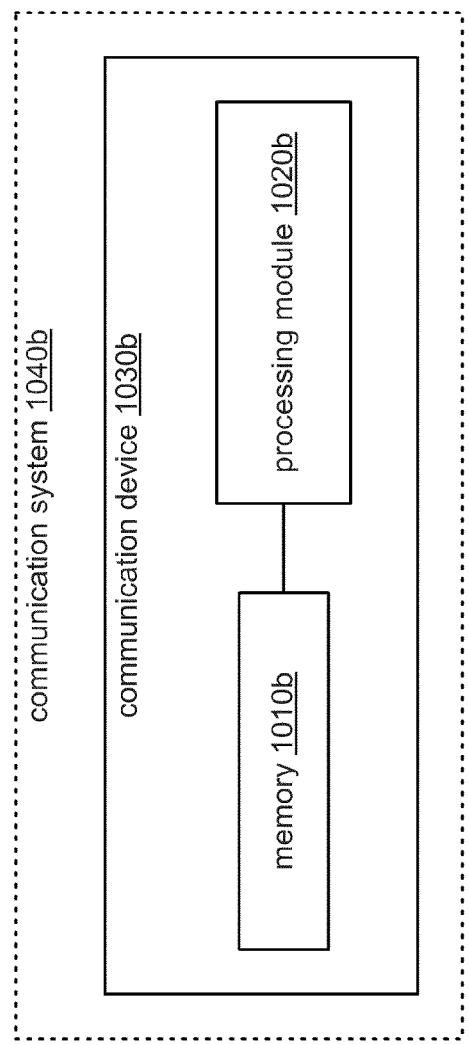
FIG. 10B illustrates an embodiment of an apparatus that is operative to perform error correction using CRC and redundant bit streams.

FIG. 10B illustrates an embodiment of an apparatus 1002 that is operative to perform error correction using CRC and redundant bit streams. The apparatus 1002 includes a processing circuitry 1020*b*, and a memory 1010*b*. The memory 1010*b* is coupled to the processing circuitry 1020*b*, and the memory 1010*b* is operable to store operational instructions that enable the processing circuitry 1020*b* to perform a variety of functions. The processing circuitry 1020*b* (serviced by the memory 1010) can be implemented as an apparatus capable to perform any of the functionality of any of the various modules, circuitries, and/or functional blocks described herein. For example, the processing circuitry 1020*b* (serviced by the memory 1010) can be implemented as an apparatus capable to perform and/or direct the manner in of performing error correction using CRC and redundant bit streams in accordance with any embodiment described herein, or any equivalent thereof.

The processing circuitry 1020*b* can be implemented using a shared processing device, individual processing devices, or a plurality of processing devices, among other types of circuitry or circuitries. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 1010*b* may be a single memory device or a plurality of memory devices. Such a memory device may be a read-only memory, random access memory, volatile memory, non-volatile memory, static memory, dynamic memory, flash memory, and/or any device that stores digital information. Note that when the processing circuitry 1020*b* implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 1002 can be any of a variety of communication devices 1030*b*, or any part or portion of any such communication device 1030*b*. Any such communication device that includes the processing circuitry 1020*b* and/or memory 1010*b* can be implemented within any of a variety of communication systems 1040*b* as well. If desired, the communication device 1030*b* may be implemented in a communication system 1040*b*, and the processing circuitry 1020*b* and memory 1010*b* may be located within the communication device 1030*b*.

It is also noted that various embodiments of performing error correction using CRC and redundant bit streams in accordance with any embodiment presented herein, and equivalents thereof, may be applied to many types of communication systems and/or communication devices.

Many of diagrams described below correspond to method that may be performed by or within a communication device that may be implemented and operative within any of a variety of communication systems.

FIG. 11 illustrates an embodiment of a method 1100 for performing error correction using CRC and redundant bit streams.

Referring to method 1100 of FIG. 11, the method 1100 begins by receiving, from a communication channel, a first signal sequence and a second signal sequence that corresponds to a retransmission of the first signal sequence (e.g., the second signal sequence being a copy of the first signal sequence, yet being a transmitted copy thereof), as shown in a block 1110.

The method 1100 continues by determining one or more bit error locations within the first signal sequence and the second signal sequence in accordance with mapping operations (e.g., XOR) of the first signal sequence and the second signal sequence, as shown in a block 1120. The method 1100 then operates by selecting one or more permutation syndromes based on mapping operations (e.g., XOR), as shown in a block 1130. In some instances, only single-bit error syndromes are needed (e.g., when only a singular most likely or potential bit error location is determined). However, in some instances, two or more most likely (or potential) bit error locations may be determined, and linear combinations (summations) of multiple single-bit error syndromes are combined together (in real time) for use in comparison against a CRC remainder of the received first (or second) signal sequence. Those permutation syndromes that match the CRC remainder are identified as being possible solutions. One, two or more, or no solutions may be identified in a given situation.

The method 1100 continues by determining if a single solution is arrived upon, as shown in a decision block 1140 (e.g., a single permutation syndrome), this is a unique and correct solution and a corrected signal sequence may be generated. Such generation of a corrected signal sequence may be made by flipping bits, as shown in a block 1150. Alternatively, when more than one solution is arrived upon (e.g., two or more permutation syndromes), a CRC failure may be deemed, as shown in a block 1160, or one of the permutation syndromes may be selected as being the 'solution' using any desired decision means or constraint.

Figure 12B:
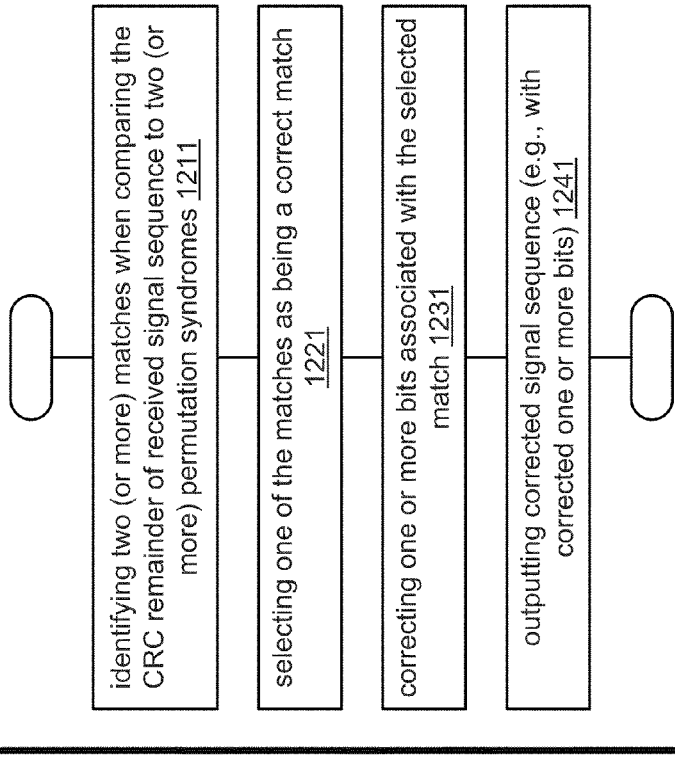
FIG. 12B illustrates an embodiment of an alternative method for selecting and identifying at least one bit-error corresponding to at least one bit-error location.
Figure 12A:
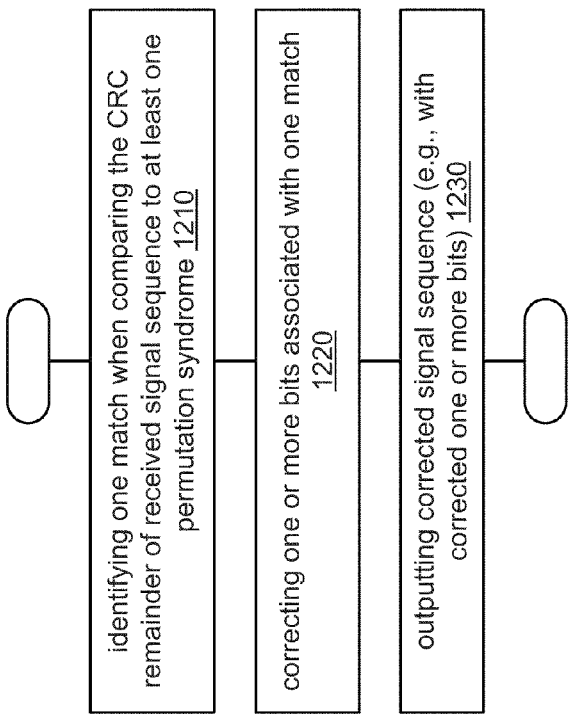
FIG. 12A illustrates an embodiment of a method for selecting and identifying at least one bit-error corresponding to at least one bit-error location.

The diagrams corresponding to FIG. 12A and FIG. 12B may be viewed as operating in conjunction with identifying one or more matches when comparing possible values as calculated based on received signals sequences (e.g., a first signal sequence and at least one redundant signal sequence)

and predetermined values (e.g., that may be calculated off-line and stored in some desired memory).

FIG. 12A illustrates an embodiment of a method 1200 for selecting and identifying at least one bit-error corresponding to at least one bit-error location.

Referring to method 1200 of FIG. 12A, the method 1200 begins by identifying one match when comparing the CRC remainder of received signal sequence to at least one permutation syndrome, as shown in a block 1210. The method 1200 continues by correcting one or more bits associated with one match, as shown in a block 1220. The method 1200 then operates by outputting the corrected signal sequence (e.g., with the corrected one or more bits), as shown in a block 1230.

FIG. 12B illustrates an embodiment of an alternative method 1201 for selecting and identifying at least one bit-error corresponding to at least one bit-error location.

Referring to method 1201 of FIG. 12B, the method 1201 begins by identifying two (or more) matches when comparing the CRC remainder of received signal sequence to two (or more) permutation syndromes, as shown in a block 1211. The method 1201 then operates by selecting one of the matches as being a correct match, as shown in a block 1221.

The method 1201 continues by correcting one or more bits associated with the selected match, as shown in a block 1231. The method 1201 then operates by outputting the corrected signal sequence (e.g., with the corrected one or more bits), as shown in a block 1241.

Figure 13B:
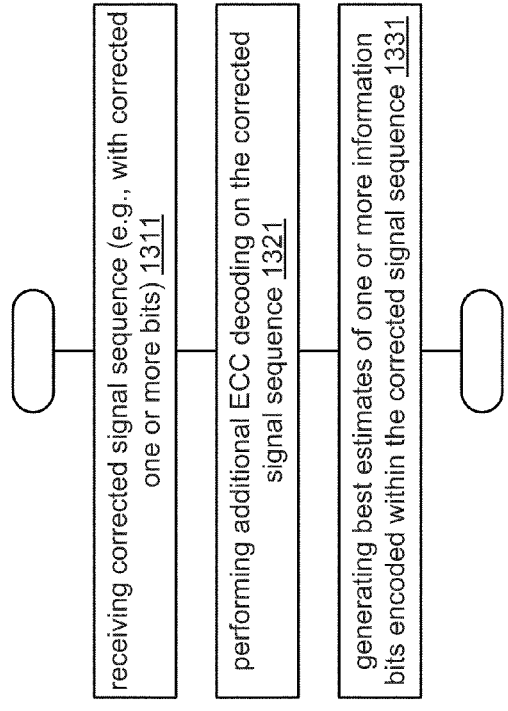
FIG. 13B illustrates an embodiment of a method for performing additional ECC decoding in accordance with error correction using CRC and redundant bit streams.
Figure 13A:
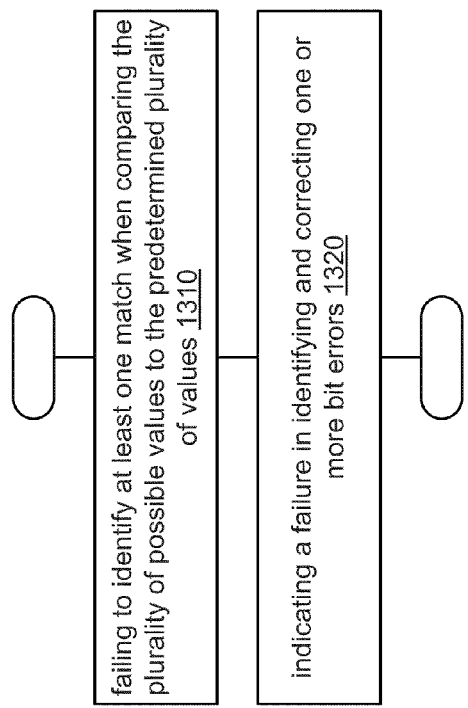
FIG. 13A illustrates an embodiment of a method for identifying failure of error correction using CRC and redundant bit streams.

FIG. 13A illustrates an embodiment of a method 1300 for identifying failure of error correction using CRC and redundant bit streams. Referring to method 1300 of FIG. 13A, the method 1300 begins by failing to identify at least one match when comparing the plurality of possible values to the predetermined plurality of values, as shown in a block 1310. The method 1300 continues by indicating a failure in identifying and correcting one or more bit errors, as shown in a block 1320.

FIG. 13B illustrates an embodiment of a method 1301 for performing additional ECC decoding in accordance with error correction using CRC and redundant bit streams. Referring to method 1301 of FIG. 13B, the method 1301 begins by receiving corrected signal sequence (e.g., with corrected one or more bits), as shown in a block 1311. The method 1301 then operates by performing additional ECC decoding on the corrected signal sequence, as shown in a block 1321. The method 1301 continues by generating best estimates of one or more information bits encoded within the corrected signal sequence, as shown in a block 1331.

Figure 14:
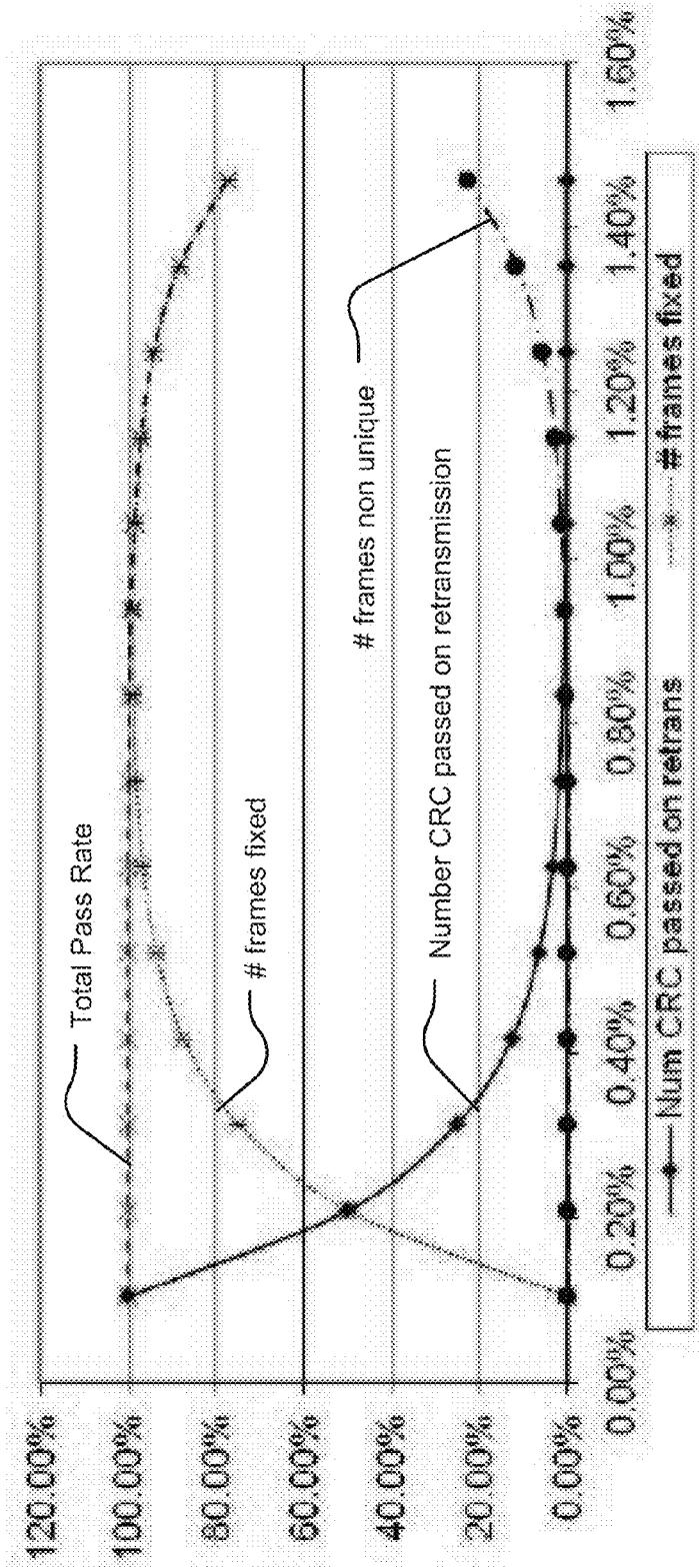
FIG. 14 illustrates an embodiment of a performance diagram corresponding to error correction using CRC and redundant bit streams.

FIG. 14 illustrates an embodiment of a performance diagram 1400 corresponding to error correction using CRC and redundant bit streams. The error correction approach presented herein has been implemented within a Bluetooth simulation of an extended synchronous connection oriented (eSCO) channel with 480 bits per packet. In the implementation, the communication channel is protected by the 16-bit CRC "CCITT-16" with a Hamming Distance of 4, and the maximum number of retransmissions allowed is 2, hence the various results consider up to 2 retransmissions. The performance for 1 retransmission is shown in FIG. 14 (i.e., a first transmission and a second transmission that is redundant with respect to the first transmission).

The number of frames that pass CRC based solely on retransmission shows a steep drop-off as the random bit-error rate increases, and it is less than 1% when the bit-error rate reaches 0.8%. The number of frames fixed by the novel error correction approach presented herein (CRC-EC) increases to compensate for this drop-off such that the sum of the fixed frames and correctly received frames (hence the total number of correctly received frames) is greater than 99% until the random bit-error rate exceeds 1%. The total pass rate decreases once the random bit-error rate exceeds 1% due to the increasing probability that the Hamming Distance of the CRC is exceeded and multiple CRC solutions result.

Figure 15:
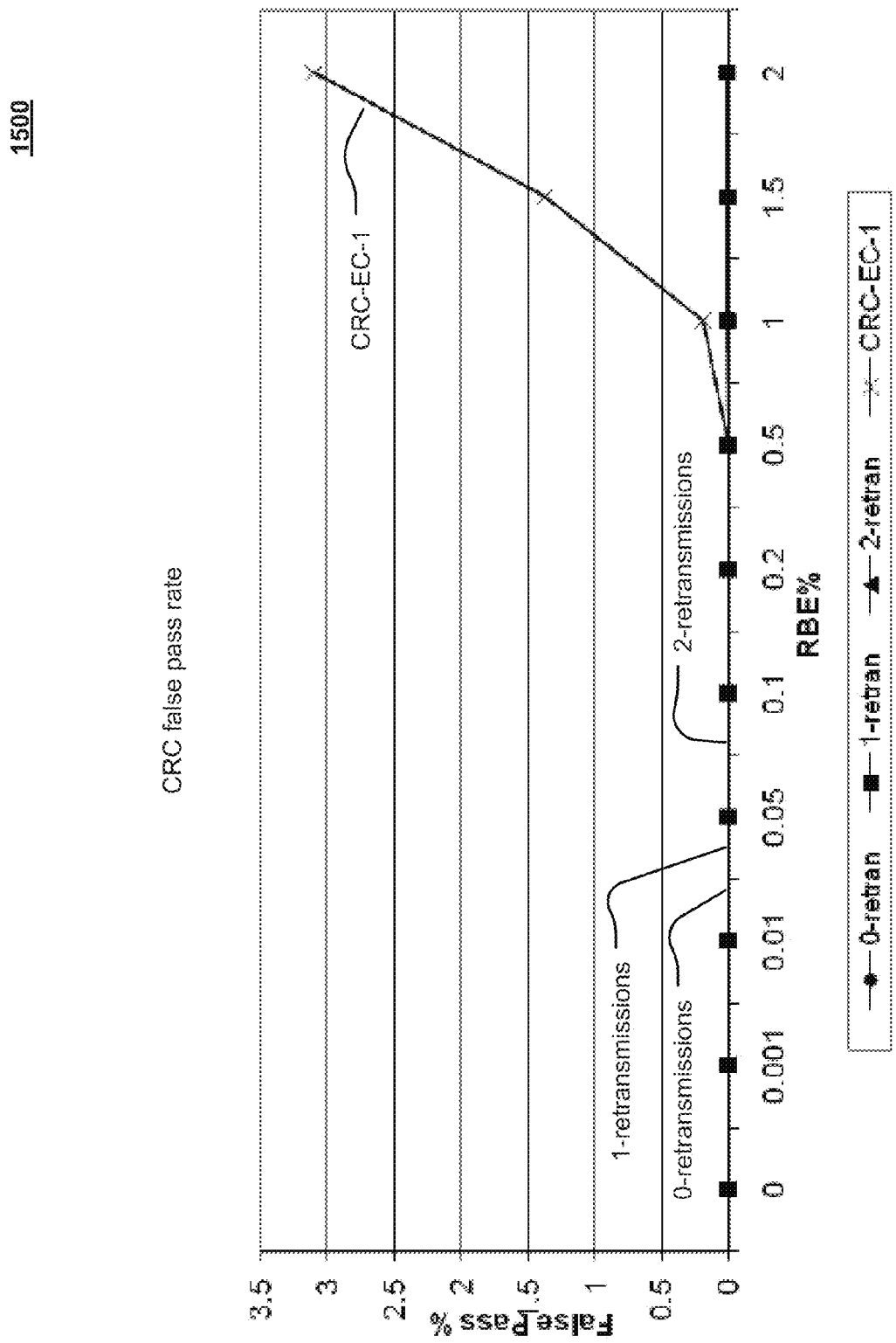
FIG. 15 illustrates an embodiment of a diagram corresponding to CRC false pass rate for different retransmission schemes.

FIG. 15 illustrates an embodiment of a diagram 1500 corresponding to CRC false pass rate for different retransmission schemes. When a bit-error unfortunately hits both streams (both the first stream and a redundant stream) in the same bit position, the resulting mapping (XOR mapping) will consequently not indicate a bit-error in that particular position. As a result, the novel error correction approach presented herein (CRC-EC) then does not consider that particular bit position in the permutations and cannot correctly solve the CRC. In such a situation, there are then three outcomes: (1) no solutions are found; (2) a single solution is found; (3) multiple solutions are found. In the case of (1) and (3), the error correction approach presented herein (CRC-EC) will fail the CRC. However, in the case of (2) the algorithm will nonetheless declare that the solution has been found. As a result, the wrong bits will be flipped to give an incorrect solution to the CRC. Of course, the chance that a bit-error hits both streams in the same exact location is very small but does increase as the bit-error rate increases. Still, the CRC will be incorrectly passed only in the unlikely event that a unique, yet incorrect solution is arrived upon. This "False Pass %" is shown in FIG. 15 as a function of the random bit-error rate. The false pass rate remains negligible up to approximately 1% after which it ramps up. However, for most applications, the trade-off between CRC Pass Rate and CRC False Pass Rate is almost certainly worth it. For example, at 1% RBE, the CRC Pass Rate increases from 3% to 95% while the False Pass Rate increases from near 0% to 0.19%.

Figure 16:
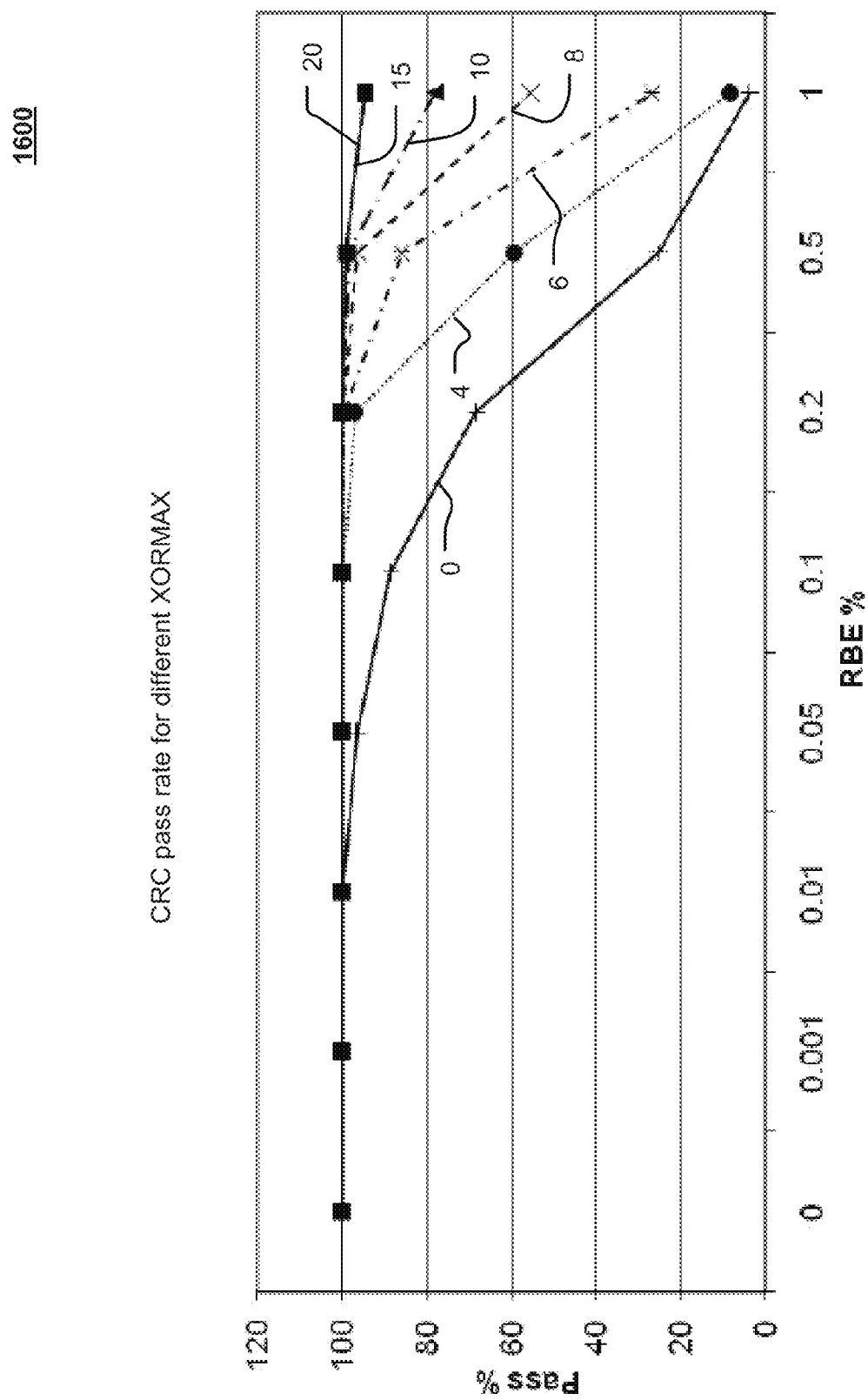
FIG. 16 illustrates an embodiment of a diagram corresponding to CRC pass rate as a function of the XOR map maximum complexity.

FIG. 16 illustrates an embodiment of a diagram 1600 corresponding to CRC pass rate as a function of the XOR map maximum complexity. As discussed above, the number of permutations in the summation of Equation (17) increases exponentially with the number of bit-errors indicated by an XOR mapping. Even though only a table lookup (retrieval from a memory) and XOR summation is required instead of performing a full CRC computation, the sheer number of permutations may become prohibitive for certain applications. One approach to limit the complexity of this large number of permutations is to limit the number of bit-errors considered in the XOR mapping. If this number is exceeded, the CRC is simply failed. FIG. 16 shows the CRC Pass Rate as this maximum (XORMAX) threshold is varied. As expected, the performance degrades as XORMAX is reduced and the RBE % exceeds a certain bound. Still, significant performance improvement is obtained over the singular retransmission (1-retrans) case for relatively small XOR-MAX. An alternative approach would be to limit the total number of permutations considered instead of placing a hard limit on the XOR Map non-zero locations (results still to be obtained).

It is noted that, the number of sums to be performed in accordance with permutation syndrome calculations will increase exponentially as a function of the number of bit errors within a signal sequence (e.g., where the number of sums=$2^N$, where N is the number of bit errors within the signal sequence.

FIG. 17 illustrates an embodiment of a diagram 1700 corresponding to speech quality for different retransmission and error concealment schemes. Finally, the performance is evaluated in terms of speech quality across a Bluetooth eSCO link using the wideband audio coder sub-band codec (SBC) with 7.5 ms frames (480 bits) and up to 2 retransmissions. The performance is evaluated using wideband perceptual evaluation of speech quality (PESQ) wideband PESQ (WPESQ). Different error concealment schemes are also compared. The results are shown in FIG. 17. First, a description of the various error concealment schemes is provided as follows: (1) PLC-x decodes the frame with SBC if the CRC passes and uses Packet Loss Concealment (PLC) if the CRC fails, where 'x' indicates the number of retransmissions attempted in the case of CRC failure at the receiver; (2) SBC-x decodes with SBC regardless of the result of the CRC, where 'x' again indicates the number of attempted retransmissions; (3) BEC-x utilizes Bit-Error Concealment (BEC) schemes based on the number of streams present and the 'a-priori' knowledge of the location of the sensitive bits in SBC; (4) CRC-EC-1 is the novel error correction approach presented herein in combination with BEC-1 in the case that the CRC fails. This implementation uses at most 1 retransmission (i.e., a singular retransmission (1-retrans) in conjunction with the original transmission, so that two copies of the same data transmitted stream/signal sequence are available for use). As can be seen from FIG. 17, the CRC-EC-1 system provides for a significant speech quality improvement when compared to the other approaches. For example, at 0.5% RBE, the performance of BEC-1 is improved from a PESQ of 1.818 to a score of 4.209.

It is noted that the various modules and/or circuitries (e.g., encoding modules and/or circuitries, decoding modules and/or circuitries, processing modulations and/or circuitries, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory (ROM), random access memory (RAM), volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

It is also noted that any of the connections or couplings between the various modules, circuits, functional blocks, components, devices, etc. within any of the various diagrams or as described herein may be differently implemented in different embodiments. For example, in one embodiment, such connections or couplings may be direct connections or direct couplings there between. In another embodiment, such connections or couplings may be indirect connections or indirect couplings there between (e.g., with one or more intervening components there between). Of course, certain other embodiments may have some combinations of such connections or couplings therein such that some of the connections or couplings are direct, while others are indirect. Different implementations may be employed for effectuating communicative coupling between modules, circuits, functional blocks, components, devices, etc. without departing from the scope and spirit of the invention.

Various aspects of the present invention have also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

Various aspects of the present invention have been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, various aspects of the present invention are not limited to such embodiments. It will be obvious to one of average skill in the art that various changes and modifications may be practiced within the spirit and scope of the invention, as limited only by the scope of the appended claims.

What is claimed is:

1. An apparatus, comprising:
a bit error identification circuitry to determine at least one bit-error location within a first signal sequence using at least one of the first signal sequence and a second signal sequence;
a permutation selection circuitry, coupled to the bit error identification circuitry, to determine, based on the at least one bit-error location, at least one permutation syndrome corresponding to a cyclic redundancy check (CRC) remainder of the first signal sequence; and
a processing circuitry, coupled to the permutation selection circuitry, to generate a corrected signal sequence using the at least one of the first signal sequence and the second signal sequence.

2. The apparatus of claim 1, wherein the bit error identification circuitry comprising:
an XOR mapping circuitry to perform XOR processing of individual bits within each of the first signal sequence and the second signal sequence to determine the at least one bit-error location.

3. The apparatus of claim 1, wherein:
the bit error identification circuitry to employ soft information corresponding to bits within at least one of the first signal sequence and the second signal sequence to determine the at least one bit-error location.

4. The apparatus of claim 1, wherein:
the second signal sequence being a retransmission of the first signal sequence.

5. The apparatus of claim 1, wherein:
the at least one permutation syndrome being a linear combination of a first syndrome corresponding to first single bit error within first signal sequence and a second syndrome corresponding to second single bit error within first signal sequence.

6. The apparatus of claim 5, further comprising:
a memory, coupled to the processing circuitry, to store a plurality of syndromes respectively differentiated in accordance with gray coding; and wherein:
the permutation selection circuitry to select the first syndrome and the second syndrome from the plurality of syndromes.

7. The apparatus of claim 1, wherein:
the processing circuitry to flip at least one bit within the at least one of the first signal sequence and the second signal sequence in accordance with generating the corrected signal sequence.

8. The apparatus of claim 1, wherein:
each of the first signal sequence and the second signal sequence respectively including error correction code (ECC) encoded bits therein.

9. The apparatus of claim 8, wherein:
the ECC being a convolutional code, a Reed-Solomon (RS) code, a turbo code, a trellis coded modulation (TCM) code, a turbo trellis coded modulation (TTCM) code, a low density parity check (LDPC) code, or a BCH (Bose and Ray-Chaudhuri, and Hocquenghem) code.

10. The apparatus of claim 1, wherein:
a decoder circuitry, coupled to the processing circuitry, to decode the at least one of the first signal sequence and the second signal sequence to generate estimates of error correction code (ECC) encoded bits therein.

11. The apparatus of claim 1, wherein:
the apparatus being a communication device; and
the communication device being operable to be implemented within at least one of a satellite communication system, a wireless communication system, a wired communication system, and a fiber-optic communication system.

12. An apparatus, comprising:
an input to receive a first signal sequence and a second signal sequence from a communication channel, wherein the second signal sequence corresponding to a redundant transmission of the first signal sequence;
a bit error identification circuitry to determine at least one bit-error location within the first signal sequence in accordance with XOR mapping processing of the first signal sequence and the second signal sequence;
a permutation selection circuitry, coupled to the bit error identification circuitry, for determining, based on the at least one bit-error location, at least one permutation syndrome corresponding to a cyclic redundancy check (CRC) remainder of the first signal sequence; and
a processing circuitry, coupled to the permutation selection circuitry, to generate a corrected signal sequence using the at least one of the first signal sequence and the second signal sequence.

13. The apparatus of claim 12, wherein:
the at least one permutation syndrome being a linear combination of a first syndrome corresponding to first single bit error within first signal sequence and a second syndrome corresponding to second single bit error within first signal sequence.

14. The apparatus of claim 13, further comprising:
a memory, coupled to the processing circuitry, to store a plurality of syndromes respectively differentiated in accordance with gray coding; and wherein:
the permutation selection circuitry to select the first syndrome and the second syndrome from the plurality of syndromes.

15. The apparatus of claim 12, wherein:
the processing circuitry to flip at least one bit within the at least one of the first signal sequence and the second signal sequence in accordance with generating the corrected signal sequence.

16. The apparatus of claim 12, wherein:
each of the first signal sequence and the second signal sequence respectively including error correction code (ECC) encoded bits therein.

17. The apparatus of claim 16, wherein:
the ECC being a convolutional code, a Reed-Solomon (RS) code, a turbo code, a trellis coded modulation (TCM) code, a turbo trellis coded modulation (TTCM) code, a low density parity check (LDPC) code, or a BCH (Bose and Ray-Chaudhuri, and Hocquenghem) code.

18. The apparatus of claim 12, wherein:
a decoder circuitry, coupled to the processing circuitry, to decode the at least one of the first signal sequence and the second signal sequence to generate estimates of error correction code (ECC) encoded bits therein.

19. A method for operating a communication device, the method comprising:
receiving a first signal sequence from a communication channel;
determining at least one bit-error location within the first signal sequence using at least one of the first signal sequence and a second signal sequence;
determining, based on the at least one bit-error location, at least one permutation syndrome corresponding to a cyclic redundancy check (CRC) remainder of the first signal sequence; and
generating a corrected signal sequence using the at least one of the first signal sequence and the second signal sequence.

20. The method of claim 19, further comprising:
performing XOR processing of individual bits within each of the first signal sequence and the second signal sequence for determining the at least one bit-error location.

21. The method of claim 19, further comprising:
employing soft information corresponding to bits within at least one of the first signal sequence and the second signal sequence for determining the at least one bit-error location.

22. The method of claim 19, wherein:
the second signal sequence being a retransmission of the first signal sequence.

23. The method of claim 19, wherein:
the at least one permutation syndrome being a linear combination of a first syndrome corresponding to first single bit error within first signal sequence and a second syndrome corresponding to second single bit error within first signal sequence.

24. The method of claim 23, further comprising:
storing a plurality of syndromes respectively differentiated in accordance with gray coding within a memory of the communication device; and
selecting the first syndrome and the second syndrome from the plurality of syndromes.

25. The method of claim 19, further comprising:
flipping at least one bit within the at least one of the first signal sequence and the second signal sequence in accordance with generating the corrected signal sequence.

26. The method of claim 19, wherein:
each of the first signal sequence and the second signal sequence respectively including error correction code (ECC) encoded bits therein.

27. The method of claim 26, wherein:
the ECC being a convolutional code, a Reed-Solomon (RS) code, a turbo code, a trellis coded modulation (TCM) code, a turbo trellis coded modulation (TTCM) code, a low density parity check (LDPC) code, or a BCH (Bose and Ray-Chaudhuri, and Hocquenghem) code.

28. The method of claim 19, further comprising:
decoding the at least one of the first signal sequence and the second signal sequence thereby generating estimates of error correction code (ECC) encoded bits therein.

29. The method of claim 19, wherein:
the communication device being operable to be implemented within at least one of a satellite communication system, a wireless communication system, a wired communication system, and a fiber-optic communication system.

* * * * *